(12) United States Patent
Peterson et al.

(10) Patent No.: US 9,760,192 B2
(45) Date of Patent: *Sep. 12, 2017

(54) TOUCH SENSING

(71) Applicant: Cypress Semiconductor Corporation, San Jose, CA (US)

(72) Inventors: Jonathan R. Peterson, Everett, WA (US); Robert Michael Birch, Seattle, WA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/671,389

(22) Filed: Nov. 7, 2012

(65) Prior Publication Data

US 2013/0147732 A1 Jun. 13, 2013

Related U.S. Application Data

(63) Continuation of application No. 12/040,387, filed on Feb. 29, 2008, now Pat. No. 8,525,798.

(60) Provisional application No. 61/023,988, filed on Jan. 28, 2008.

(51) Int. Cl.
 *G06F 3/041* (2006.01)
 *G06F 3/044* (2006.01)
 *H03K 17/96* (2006.01)

(52) U.S. Cl.
 CPC .............. *G06F 3/041* (2013.01); *G06F 3/044* (2013.01); *G06F 3/0416* (2013.01); *H03K 17/9622* (2013.01); *H03K 2217/960775* (2013.01)

(58) Field of Classification Search
 CPC ............ G06F 3/041; G09G 2320/0693; G09G 3/006; G01F 23/284; G01F 23/2845
 USPC .................................................. 345/173, 174
 See application file for complete search history.

(56) References Cited

U.S. PATENT DOCUMENTS

| | | |
|---|---|---|
| 3,660,801 A | 5/1972 | Paulfus |
| 3,921,167 A | 11/1975 | Fox |
| 3,979,745 A | 9/1976 | Bishop |
| 4,039,940 A | 8/1977 | Butler et al. |
| 4,090,092 A | 5/1978 | Serrano |
| 4,103,252 A | 7/1978 | Bobick |
| 4,113,378 A | 9/1978 | Wirtz |

(Continued)

FOREIGN PATENT DOCUMENTS

| | | |
|---|---|---|
| CN | 101896825 A | 11/2010 |
| EP | 0574213 A | 12/1993 |

(Continued)

OTHER PUBLICATIONS

"CSD User Module Data Sheet," CSD v1.0, Oct. 23, 2006; 58 pages.

(Continued)

*Primary Examiner* — Afroza Chowdhury

(57) ABSTRACT

A method and apparatus varying, by interval, a frequency of a drive signal applied to one electrode of each of a plurality of electrode pairs, select a frequency corresponding to the frequency of the drive signal, monitor changes in capacitance of each of the electrode pairs through receive signals at the selected frequency, from the other electrode of each of the plurality of electrode pairs; and determine a position of at least two objects, which are simultaneously on a touch device, according to the monitored capacitance changes.

19 Claims, 8 Drawing Sheets

(56) References Cited

U.S. PATENT DOCUMENTS

| | | |
|---|---|---|
| 4,145,748 A | 3/1979 | Eichelberger et al. |
| 4,193,063 A | 3/1980 | Hitt et al. |
| 4,238,711 A | 12/1980 | Wallot |
| 4,264,903 A | 4/1981 | Bigelow |
| 4,266,144 A | 5/1981 | Bristol |
| 4,283,713 A | 8/1981 | Philipp |
| 4,292,604 A | 9/1981 | Embree et al. |
| 4,293,734 A | 10/1981 | Pepper, Jr. |
| 4,305,135 A | 12/1981 | Dahl et al. |
| 4,438,404 A | 3/1984 | Philipp |
| 4,475,151 A | 10/1984 | Philipp |
| 4,497,575 A | 2/1985 | Philipp |
| 4,558,274 A | 12/1985 | Carusillo |
| 4,560,830 A | 12/1985 | Perl |
| 4,586,260 A | 5/1986 | Baxter et al. |
| 4,614,937 A | 9/1986 | Poujois |
| 4,728,932 A | 3/1988 | Atherton |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,831,325 A | 5/1989 | Watson, Jr. |
| 4,876,534 A | 10/1989 | Mead et al. |
| 4,878,013 A | 10/1989 | Andermo |
| 4,879,461 A | 11/1989 | Philipp |
| 4,879,505 A | 11/1989 | Barrow et al. |
| 4,879,508 A | 11/1989 | Andermo |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A | 12/1990 | Nishihara |
| 5,008,497 A | 4/1991 | Asher |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,089,757 A | 2/1992 | Wilson |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,214,388 A | 5/1993 | Vranish et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,323,158 A | 6/1994 | Ferguson, Jr. |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,373,245 A | 12/1994 | Vranish et al. |
| 5,374,787 A | 12/1994 | Miller et al. |
| 5,381,515 A | 1/1995 | Platt et al. |
| 5,384,467 A | 1/1995 | Plimon et al. |
| 5,386,219 A | 1/1995 | Greanias et al. |
| 5,386,584 A | 1/1995 | Verstegen et al. |
| 5,408,194 A | 4/1995 | Steinbach et al. |
| 5,412,387 A | 5/1995 | Vincelette et al. |
| 5,424,756 A | 6/1995 | Ho et al. |
| 5,461,321 A | 10/1995 | Sanders et al. |
| 5,479,103 A | 12/1995 | Kernahan et al. |
| 5,488,204 A | 1/1996 | Mead et al. |
| 5,495,077 A | 2/1996 | Miller et al. |
| 5,518,078 A | 5/1996 | Tsujioka et al. |
| 5,525,980 A | 6/1996 | Jahier et al. |
| 5,541,580 A | 7/1996 | Gerston et al. |
| 5,541,878 A | 7/1996 | Lemoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,589,856 A | 12/1996 | Stein et al. |
| 5,629,891 A | 5/1997 | Lemoncheck et al. |
| 5,648,642 A | 7/1997 | Miller et al. |
| 5,650,597 A | 7/1997 | Redmayne |
| 5,670,915 A | 9/1997 | Cooper et al. |
| 5,672,959 A | 9/1997 | Der |
| 5,680,070 A | 10/1997 | Anderson et al. |
| 5,682,032 A | 10/1997 | Philipp |
| 5,684,487 A | 11/1997 | Timko |
| 5,691,513 A | 11/1997 | Yamamoto et al. |
| 5,694,063 A | 12/1997 | Burlison et al. |
| 5,730,165 A | 3/1998 | Philipp |
| 5,748,185 A | 5/1998 | Stephan et al. |
| 5,757,368 A | 5/1998 | Gerpheide et al. |
| 5,760,852 A | 6/1998 | Wu et al. |
| 5,763,909 A | 6/1998 | Mead et al. |
| 5,763,924 A | 6/1998 | Lum et al. |
| 5,767,457 A | 6/1998 | Gerpheide et al. |
| 5,796,183 A | 8/1998 | Hourmand et al. |
| 5,801,340 A | 9/1998 | Peter |
| 5,812,698 A | 9/1998 | Platt et al. |
| 5,841,078 A | 11/1998 | Miller et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,905,489 A * | 5/1999 | Takahama et al. ........... 345/174 |
| 5,914,465 A | 6/1999 | Allen et al. |
| 5,914,708 A | 6/1999 | Lagrange et al. |
| 5,920,309 A | 7/1999 | Bisset et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,037,929 A | 3/2000 | Ogura et al. |
| 6,037,930 A | 3/2000 | Wolfe et al. |
| 6,060,957 A | 5/2000 | Kodrnja et al. |
| 6,067,019 A | 5/2000 | Scott |
| 6,097,432 A | 8/2000 | Mead et al. |
| 6,145,850 A | 11/2000 | Rehm |
| 6,148,104 A | 11/2000 | Wang et al. |
| 6,184,871 B1 | 2/2001 | Teres et al. |
| 6,185,450 B1 | 2/2001 | Seguine et al. |
| 6,188,228 B1 | 2/2001 | Philipp |
| 6,188,391 B1 | 2/2001 | Seely et al. |
| 6,191,723 B1 | 2/2001 | Lewis |
| 6,222,528 B1 | 4/2001 | Gerpheide et al. |

(56) References Cited

U.S. PATENT DOCUMENTS

| | | |
|---|---|---|
| 6,239,389 B1 | 5/2001 | Allen et al. |
| 6,249,447 B1 | 6/2001 | Boylan et al. |
| 6,262,717 B1 | 7/2001 | Donohue et al. |
| 6,271,719 B1 | 8/2001 | Sevastopoulos |
| 6,271,720 B1 | 8/2001 | Sevastopoulos |
| 6,271,835 B1 | 8/2001 | Hoeksma |
| 6,278,283 B1 | 8/2001 | Tsugai |
| 6,280,391 B1 | 8/2001 | Olson et al. |
| 6,288,707 B1 | 9/2001 | Philipp |
| 6,295,052 B1 | 9/2001 | Kato et al. |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,342,817 B1 | 1/2002 | Crofts et al. |
| 6,344,773 B1 | 2/2002 | Sevastopoulos et al. |
| 6,353,200 B1 | 3/2002 | Schwankhart |
| 6,366,099 B1 | 4/2002 | Reddi |
| 6,377,009 B1 | 4/2002 | Philipp |
| 6,377,129 B1 | 4/2002 | Rhee et al. |
| 6,380,929 B1 | 4/2002 | Platt |
| 6,380,931 B1 | 4/2002 | Gillespie et al. |
| 6,400,217 B1 | 6/2002 | Bhandari |
| 6,414,671 B1 | 7/2002 | Gillespie et al. |
| 6,424,338 B1 | 7/2002 | Anderson |
| 6,430,305 B1 | 8/2002 | Decker |
| 6,441,073 B1 | 8/2002 | Tanaka et al. |
| 6,441,682 B1 | 8/2002 | Vinn et al. |
| 6,445,257 B1 | 9/2002 | Cox et al. |
| 6,448,911 B1 | 9/2002 | Somayajula |
| 6,452,514 B1 | 9/2002 | Philipp |
| 6,457,355 B1 | 10/2002 | Philipp |
| 6,459,321 B1 | 10/2002 | Belch |
| 6,466,036 B1 | 10/2002 | Philipp |
| 6,473,069 B1 | 10/2002 | Gerpheide |
| 6,476,798 B1 | 11/2002 | Bertram et al. |
| 6,489,899 B1 | 12/2002 | Ely et al. |
| 6,490,203 B1 | 12/2002 | Tang |
| 6,498,720 B2 | 12/2002 | Glad |
| 6,499,359 B1 | 12/2002 | Washeleski et al. |
| 6,522,083 B1 | 2/2003 | Roach |
| 6,522,128 B1 | 2/2003 | Ely et al. |
| 6,522,187 B1 | 2/2003 | Sousa |
| 6,523,416 B2 | 2/2003 | Takagi et al. |
| 6,529,015 B2 | 3/2003 | Nonoyama et al. |
| 6,534,970 B1 | 3/2003 | Ely et al. |
| 6,535,200 B2 | 3/2003 | Philipp |
| 6,570,557 B1 | 5/2003 | Westerman et al. |
| 6,574,095 B2 | 6/2003 | Suzuki |
| 6,577,140 B1 | 6/2003 | Wenman |
| 6,583,632 B2 | 6/2003 | Von Basse et al. |
| 6,587,093 B1 | 7/2003 | Shaw et al. |
| 6,597,347 B1 | 7/2003 | Yasutake |
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,758 B2 | 1/2004 | Maki et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,690,066 B1 | 2/2004 | Lin et al. |
| 6,704,005 B2 | 3/2004 | Kato et al. |
| 6,705,511 B1 | 3/2004 | Dames et al. |
| 6,714,817 B2 | 3/2004 | Daynes et al. |
| 6,720,777 B2 | 4/2004 | Wang |
| 6,730,863 B1 | 5/2004 | Gerpheide et al. |
| 6,731,121 B1 | 5/2004 | Hsu et al. |
| 6,744,258 B2 | 6/2004 | Ishio et al. |
| 6,750,852 B2 | 6/2004 | Gillespie et al. |
| 6,768,420 B2 | 7/2004 | McCarthy et al. |
| 6,774,644 B2 | 8/2004 | Eberlein |
| 6,781,577 B2 | 8/2004 | Shigetaka |
| 6,788,221 B1 | 9/2004 | Ely et al. |
| 6,788,521 B2 | 9/2004 | Nishi |
| 6,798,218 B2 | 9/2004 | Kasperkovitz |
| 6,806,693 B1 | 10/2004 | Bron |
| 6,809,275 B1 | 10/2004 | Cheng et al. |
| 6,810,442 B1 | 10/2004 | Lin et al. |
| 6,825,673 B1 | 11/2004 | Yamaoka |
| 6,825,890 B2 | 11/2004 | Matsufusa |
| 6,829,727 B1 | 12/2004 | Pawloski |
| 6,838,887 B2 | 1/2005 | Denen et al. |
| 6,839,052 B1 | 1/2005 | Kramer |
| 6,856,433 B2 | 2/2005 | Hatano et al. |
| 6,859,159 B2 | 2/2005 | Michalski |
| 6,861,961 B2 | 3/2005 | Sandbach et al. |
| 6,873,203 B1 | 3/2005 | Latham, II et al. |
| 6,879,215 B1 | 4/2005 | Roach |
| 6,882,338 B2 | 4/2005 | Flowers |
| 6,888,536 B2 | 5/2005 | Westerman et al. |
| 6,888,538 B2 | 5/2005 | Ely et al. |
| 6,891,531 B2 | 5/2005 | Lin |
| 6,893,724 B2 | 5/2005 | Lin et al. |
| 6,897,673 B2 | 5/2005 | Savage et al. |
| 6,903,402 B2 | 6/2005 | Miyazawa |
| 6,904,570 B2 | 6/2005 | Foote et al. |
| 6,914,547 B1 | 7/2005 | Swaroop et al. |
| 6,933,873 B1 | 8/2005 | Horsley et al. |
| 6,940,291 B1 | 9/2005 | Ozick |
| 6,946,853 B2 | 9/2005 | Gifford et al. |
| 6,949,811 B2 | 9/2005 | Miyazawa |
| 6,949,937 B2 | 9/2005 | Knoedgen |
| 6,958,594 B2 | 10/2005 | Redl et al. |
| 6,969,978 B2 | 11/2005 | Dening |
| 6,970,120 B1 * | 11/2005 | Bjornsen ............... 341/120 |
| 6,970,126 B1 | 11/2005 | O'Dowd et al. |
| 6,975,123 B1 | 12/2005 | Malang et al. |
| 6,993,607 B2 | 1/2006 | Philipp |
| 6,999,009 B2 | 2/2006 | Monney |
| 7,002,557 B2 | 2/2006 | Iizuka et al. |
| 7,006,078 B2 | 2/2006 | Kim |
| 7,006,938 B2 | 2/2006 | Laraia et al. |
| 7,030,782 B2 | 4/2006 | Ely et al. |
| 7,030,860 B1 | 4/2006 | Hsu et al. |
| 7,031,886 B1 | 4/2006 | Hargreaves |
| 7,032,051 B2 | 4/2006 | Reay et al. |
| 7,036,096 B1 | 4/2006 | Sarkar et al. |
| 7,046,230 B2 | 5/2006 | Zadesky et al. |
| 7,068,039 B2 | 6/2006 | Parker |
| 7,075,316 B2 | 7/2006 | Umeda et al. |
| 7,075,523 B2 | 7/2006 | Marten et al. |
| 7,075,864 B2 | 7/2006 | Kakitsuka et al. |
| 7,078,916 B2 | 7/2006 | Denison |
| 7,098,675 B2 | 8/2006 | Inaba et al. |
| 7,109,978 B2 | 9/2006 | Gillespie et al. |
| 7,119,550 B2 | 10/2006 | Kitano et al. |
| 7,129,714 B2 | 10/2006 | Baxter |
| 7,129,935 B2 | 10/2006 | Mackey |
| 7,133,140 B2 | 11/2006 | Lukacs et al. |
| 7,133,793 B2 | 11/2006 | Ely et al. |
| 7,136,051 B2 | 11/2006 | Hein et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,276 B2 | 12/2006 | Gerlach et al. |
| 7,151,528 B2 | 12/2006 | Taylor et al. |
| 7,158,056 B2 | 1/2007 | Wright et al. |
| 7,158,125 B2 | 1/2007 | Sinclair et al. |
| 7,202,655 B2 | 4/2007 | Itoh |
| 7,202,857 B2 | 4/2007 | Hinckley et al. |
| 7,205,777 B2 | 4/2007 | Schulz et al. |
| 7,212,189 B2 | 5/2007 | Shaw et al. |
| 7,224,591 B2 | 5/2007 | Kaishita et al. |
| 7,225,090 B2 | 5/2007 | Coley |
| 7,233,508 B2 | 6/2007 | Itoh |
| 7,235,983 B2 | 6/2007 | O'Dowd et al. |
| 7,245,131 B2 | 7/2007 | Kurachi et al. |
| 7,253,643 B1 | 8/2007 | Seguine |
| 7,254,775 B2 | 8/2007 | Geaghan et al. |

(56) References Cited

U.S. PATENT DOCUMENTS

| | | | |
|---|---|---|---|
| 7,256,588 B2 | 8/2007 | Howard et al. | |
| 7,262,609 B2 | 8/2007 | Reynolds | |
| 7,271,608 B1 | 9/2007 | Vermeire et al. | |
| 7,288,946 B2 | 10/2007 | Hargreaves et al. | |
| 7,288,977 B2 | 10/2007 | Stanley | |
| 7,298,124 B2 | 11/2007 | Kan et al. | |
| 7,301,350 B2 | 11/2007 | Hargreaves et al. | |
| 7,307,485 B1 | 12/2007 | Snyder et al. | |
| 7,312,616 B2 | 12/2007 | Snyder | |
| 7,323,879 B2 | 1/2008 | Kuo et al. | |
| 7,323,886 B2 | 1/2008 | Lee | |
| 7,333,090 B2 | 2/2008 | Tanaka et al. | |
| 7,339,580 B2 | 3/2008 | Westerman et al. | |
| 7,359,816 B2 | 4/2008 | Kumar et al. | |
| 7,375,535 B1 | 5/2008 | Kutz et al. | |
| 7,381,031 B2 | 6/2008 | Kawaguchi et al. | |
| 7,392,431 B2 | 6/2008 | Swoboda | |
| 7,417,411 B2 | 8/2008 | Hoffman et al. | |
| 7,417,441 B2 | 8/2008 | Reynolds | |
| 7,423,437 B2 | 9/2008 | Hargreaves et al. | |
| 7,439,962 B2 | 10/2008 | Reynolds et al. | |
| 7,449,895 B2 | 11/2008 | Ely et al. | |
| 7,450,113 B2 | 11/2008 | Gillespie et al. | |
| 7,451,050 B2 | 11/2008 | Hargreaves | |
| 7,453,270 B2 | 11/2008 | Hargreaves et al. | |
| 7,453,279 B2 | 11/2008 | Corbin, Jr. et al. | |
| 7,466,307 B2 | 12/2008 | Trent, Jr. et al. | |
| 7,479,788 B2 | 1/2009 | Bolender et al. | |
| 7,495,659 B2 | 2/2009 | Marriott et al. | |
| 7,499,040 B2 | 3/2009 | Zadesky et al. | |
| 7,504,833 B1 | 3/2009 | Seguine | |
| 7,515,140 B2 | 4/2009 | Philipp | |
| 7,521,941 B2 | 4/2009 | Ely et al. | |
| RE40,867 E | 8/2009 | Binstead | |
| 7,598,752 B2 | 10/2009 | Li | |
| 7,598,822 B2 | 10/2009 | Rajagopal et al. | |
| 7,656,168 B2* | 2/2010 | Mahowald et al. | 324/660 |
| 7,663,607 B2 | 2/2010 | Hotelling et al. | |
| 7,667,468 B1 | 2/2010 | Anderson | |
| 7,683,641 B2 | 3/2010 | Hargreaves et al. | |
| 7,804,307 B1 | 9/2010 | Bokma et al. | |
| 7,812,827 B2 | 10/2010 | Hotelling et al. | |
| 7,812,829 B2 | 10/2010 | Gillespie et al. | |
| 7,821,274 B2 | 10/2010 | Philipp et al. | |
| 7,831,070 B1 | 11/2010 | Cheng et al. | |
| 7,911,456 B2 | 3/2011 | Gillespie et al. | |
| 7,932,897 B2 | 4/2011 | Elias et al. | |
| 8,040,142 B1 | 10/2011 | Bokma et al. | |
| 8,040,321 B2 | 10/2011 | Peng et al. | |
| 8,054,299 B2 | 11/2011 | Krah | |
| 8,067,948 B2 | 11/2011 | Sequine | |
| 8,068,097 B2 | 11/2011 | Guanghai | |
| 8,072,429 B2 | 12/2011 | Grivna | |
| 8,082,566 B2 | 12/2011 | Stallings | |
| 8,089,288 B1 | 1/2012 | Maharita | |
| 8,089,289 B1* | 1/2012 | Kremin et al. | 324/678 |
| 8,093,914 B2 | 1/2012 | Maharyta et al. | |
| 8,094,128 B2* | 1/2012 | Vu et al. | 345/173 |
| 8,144,125 B2 | 3/2012 | Peng et al. | |
| 8,144,126 B2* | 3/2012 | Wright | 345/173 |
| 8,169,238 B1 | 5/2012 | Maharyta et al. | |
| 8,358,142 B2 | 1/2013 | Maharyta | |
| 8,525,798 B2* | 9/2013 | Peterson et al. | 345/173 |
| 2001/0012667 A1 | 8/2001 | Ma et al. | |
| 2002/0000978 A1 | 1/2002 | Gerpheide | |
| 2002/0063688 A1 | 5/2002 | Shaw et al. | |
| 2002/0067348 A1 | 6/2002 | Masters et al. | |
| 2002/0080014 A1 | 6/2002 | Mccarthy et al. | |
| 2002/0109035 A1 | 8/2002 | Denen et al. | |
| 2002/0136372 A1 | 9/2002 | Bozorgui-Nesbat | |
| 2002/0140440 A1 | 10/2002 | Haase | |
| 2002/0191029 A1 | 12/2002 | Gillespie et al. | |
| 2003/0014239 A1 | 1/2003 | Ichbiah et al. | |
| 2003/0025679 A1 | 2/2003 | Taylor et al. | |
| 2003/0058053 A1 | 3/2003 | Jeon et al. | |
| 2003/0062889 A1 | 4/2003 | Ely et al. | |
| 2003/0063073 A1 | 4/2003 | Geaghan et al. | |
| 2003/0063428 A1 | 4/2003 | Nishi | |
| 2003/0076306 A1 | 4/2003 | Zadesky et al. | |
| 2003/0080755 A1 | 5/2003 | Kobayashi | |
| 2003/0091220 A1 | 5/2003 | Sato et al. | |
| 2003/0098858 A1 | 5/2003 | Perski et al. | |
| 2003/0112021 A1 | 6/2003 | Palata et al. | |
| 2003/0156098 A1 | 8/2003 | Shaw et al. | |
| 2003/0160808 A1 | 8/2003 | Foote et al. | |
| 2003/0178675 A1 | 9/2003 | Nishizaka et al. | |
| 2003/0183864 A1 | 10/2003 | Miyazawa | |
| 2003/0183884 A1 | 10/2003 | Miyazawa | |
| 2003/0184315 A1 | 10/2003 | Eberlein | |
| 2003/0189419 A1 | 10/2003 | Maki et al. | |
| 2003/0230438 A1 | 12/2003 | Keefer et al. | |
| 2003/0232507 A1 | 12/2003 | Chen | |
| 2004/0041798 A1 | 3/2004 | Kim | |
| 2004/0056845 A1 | 3/2004 | Harkcom et al. | |
| 2004/0068409 A1 | 4/2004 | Tanaka et al. | |
| 2004/0082198 A1 | 4/2004 | Nakamura et al. | |
| 2004/0169594 A1 | 9/2004 | Ely et al. | |
| 2004/0178989 A1 | 9/2004 | Shahoian et al. | |
| 2004/0178997 A1 | 9/2004 | Gillespie et al. | |
| 2004/0183560 A1 | 9/2004 | Savage et al. | |
| 2004/0209591 A1 | 10/2004 | Martin et al. | |
| 2004/0217945 A1 | 11/2004 | Miyamoto et al. | |
| 2004/0239616 A1 | 12/2004 | Collins | |
| 2004/0239650 A1 | 12/2004 | Mackey | |
| 2004/0252109 A1 | 12/2004 | Trent, Jr. et al. | |
| 2004/0263864 A1 | 12/2004 | Lukacs et al. | |
| 2005/0021269 A1 | 1/2005 | Ely et al. | |
| 2005/0024341 A1 | 2/2005 | Gillespie et al. | |
| 2005/0031175 A1 | 2/2005 | Hara et al. | |
| 2005/0062732 A1 | 3/2005 | Sinclair et al. | |
| 2005/0073302 A1 | 4/2005 | Hibbs et al. | |
| 2005/0073322 A1 | 4/2005 | Hibbs et al. | |
| 2005/0083110 A1 | 4/2005 | Latham et al. | |
| 2005/0099188 A1 | 5/2005 | Baxter | |
| 2005/0159126 A1 | 7/2005 | Wang | |
| 2005/0169768 A1 | 8/2005 | Kawaguchi et al. | |
| 2005/0179668 A1 | 8/2005 | Edwards | |
| 2005/0270273 A1 | 12/2005 | Marten | |
| 2005/0275382 A1 | 12/2005 | Stessman et al. | |
| 2005/0280639 A1 | 12/2005 | Taylor et al. | |
| 2005/0283330 A1 | 12/2005 | Laraia et al. | |
| 2006/0022660 A1 | 2/2006 | Itoh | |
| 2006/0026535 A1 | 2/2006 | Hotelling et al. | |
| 2006/0032680 A1 | 2/2006 | Elias et al. | |
| 2006/0033508 A1 | 2/2006 | Lee | |
| 2006/0033724 A1 | 2/2006 | Chaudhri et al. | |
| 2006/0038793 A1 | 2/2006 | Philipp | |
| 2006/0049834 A1 | 3/2006 | Umeda | |
| 2006/0053387 A1 | 3/2006 | Ording | |
| 2006/0066582 A1 | 3/2006 | Lyon et al. | |
| 2006/0066585 A1 | 3/2006 | Lin | |
| 2006/0097991 A1* | 5/2006 | Hotelling et al. | 345/173 |
| 2006/0097992 A1 | 5/2006 | Gitzinger et al. | |
| 2006/0108349 A1 | 5/2006 | Finley et al. | |
| 2006/0113974 A1 | 6/2006 | Kan et al. | |
| 2006/0114247 A1 | 6/2006 | Brown | |
| 2006/0139469 A1 | 6/2006 | Yokota et al. | |
| 2006/0152739 A1 | 7/2006 | Silvestre | |
| 2006/0164142 A1 | 7/2006 | Stanley | |
| 2006/0172767 A1 | 8/2006 | Cathey et al. | |
| 2006/0176718 A1 | 8/2006 | Itoh | |
| 2006/0187214 A1 | 8/2006 | Gillespie et al. | |
| 2006/0193156 A1 | 8/2006 | Kaishita et al. | |
| 2006/0197750 A1 | 9/2006 | Kerr et al. | |
| 2006/0197752 A1 | 9/2006 | Hurst et al. | |
| 2006/0221061 A1 | 10/2006 | Fry | |
| 2006/0227117 A1 | 10/2006 | Proctor | |
| 2006/0232559 A1 | 10/2006 | Chien et al. | |
| 2006/0256090 A1 | 11/2006 | Huppi | |
| 2006/0258390 A1 | 11/2006 | Cui et al. | |
| 2006/0262101 A1 | 11/2006 | Layton et al. | |
| 2006/0267953 A1 | 11/2006 | Peterson et al. | |
| 2006/0273804 A1 | 12/2006 | Delorme et al. | |
| 2006/0290678 A1 | 12/2006 | Lii | |

(56) References Cited

U.S. PATENT DOCUMENTS

| | | |
|---|---|---|
| 2007/0046299 A1 | 3/2007 | Hargreaves et al. |
| 2007/0069274 A1 | 3/2007 | Elsass et al. |
| 2007/0074913 A1 | 4/2007 | Geaghan et al. |
| 2007/0076897 A1 | 4/2007 | Philipp |
| 2007/0100566 A1 | 5/2007 | Coley |
| 2007/0132737 A1 | 6/2007 | Mulligan et al. |
| 2007/0152977 A1 | 7/2007 | Ng et al. |
| 2007/0152983 A1 | 7/2007 | Mckillop et al. |
| 2007/0164756 A1 | 7/2007 | Lee |
| 2007/0173220 A1 | 7/2007 | Kim et al. |
| 2007/0176609 A1 | 8/2007 | Ely et al. |
| 2007/0176903 A1 | 8/2007 | Dahlin et al. |
| 2007/0228256 A1 | 10/2007 | Mentzer et al. |
| 2007/0229469 A1 | 10/2007 | Seguine |
| 2007/0236478 A1 | 10/2007 | Geaghan et al. |
| 2007/0257894 A1 | 11/2007 | Philipp |
| 2007/0263191 A1 | 11/2007 | Shibazaki |
| 2007/0268243 A1 | 11/2007 | Choo et al. |
| 2007/0268265 A1 | 11/2007 | Xiaoping |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2007/0273659 A1 | 11/2007 | Xiaoping et al. |
| 2007/0291013 A1 | 12/2007 | Won |
| 2007/0296709 A1 | 12/2007 | Guanghai |
| 2008/0007529 A1 | 1/2008 | Paun et al. |
| 2008/0007534 A1 | 1/2008 | Peng et al. |
| 2008/0024455 A1 | 1/2008 | Lee et al. |
| 2008/0036473 A1 | 2/2008 | Jansson |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0047764 A1 | 2/2008 | Lee et al. |
| 2008/0048997 A1 | 2/2008 | Gillespie et al. |
| 2008/0062139 A1 | 3/2008 | Hotelling et al. |
| 2008/0062140 A1 | 3/2008 | Hotelling et al. |
| 2008/0062148 A1 | 3/2008 | Hotelling et al. |
| 2008/0068100 A1 | 3/2008 | Goodnow et al. |
| 2008/0072192 A1 | 3/2008 | Lenahan |
| 2008/0088595 A1 | 4/2008 | Liu et al. |
| 2008/0111714 A1 | 5/2008 | Kremin |
| 2008/0116904 A1 | 5/2008 | Reynolds et al. |
| 2008/0128182 A1 | 6/2008 | Westerman et al. |
| 2008/0150906 A1 | 6/2008 | Grivna |
| 2008/0158177 A1 | 7/2008 | Wilson et al. |
| 2008/0158178 A1 | 7/2008 | Hotelling et al. |
| 2008/0162997 A1 | 7/2008 | Vu et al. |
| 2008/0165134 A1 | 7/2008 | Krah |
| 2008/0179112 A1 | 7/2008 | Qin et al. |
| 2008/0180399 A1 | 7/2008 | Cheng |
| 2008/0196945 A1 | 8/2008 | Konstas |
| 2008/0250864 A1 | 10/2008 | Shipton |
| 2008/0266263 A1 | 10/2008 | Motaparti et al. |
| 2008/0278178 A1 | 11/2008 | Philipp |
| 2008/0309623 A1 | 12/2008 | Hotelling et al. |
| 2008/0309634 A1 | 12/2008 | Hotelling et al. |
| 2009/0002206 A1 | 1/2009 | Kremin |
| 2009/0096758 A1 | 4/2009 | Hotelling et al. |
| 2009/0153152 A1 | 6/2009 | Maharyta et al. |
| 2009/0322351 A1 | 12/2009 | Mcleod |
| 2010/0001973 A1 | 1/2010 | Hotelling et al. |
| 2010/0328262 A1 | 12/2010 | Huang et al. |
| 2011/0025629 A1 | 2/2011 | Grivna et al. |
| 2011/0156724 A1 | 6/2011 | Bokma et al. |
| 2011/0234523 A1 | 9/2011 | Chang et al. |
| 2012/0043140 A1* | 2/2012 | Peterson et al. ............ 178/18.06 |
| 2012/0043973 A1 | 2/2012 | Kremin |
| 2012/0043976 A1 | 2/2012 | Bokma et al. |
| 2012/0154324 A1 | 6/2012 | Wright et al. |
| 2013/0049771 A1 | 2/2013 | Peng et al. |
| 2013/0100071 A1 | 4/2013 | Wright et al. |
| 2013/0127779 A1* | 5/2013 | Lillie et al. ................ 345/174 |

FOREIGN PATENT DOCUMENTS

| | | |
|---|---|---|
| GB | 05000604 B2 | 2/2005 |
| JP | 04012528 | 1/1992 |
| JP | 05283519 B1 | 10/1993 |
| JP | 6104334 A | 4/1994 |
| JP | 6163528 A | 6/1994 |
| KR | 1020100135220 | 12/2010 |
| TW | 200946926 A | 11/2009 |
| WO | 0002188 A | 1/2000 |

OTHER PUBLICATIONS

"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.

"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.

Andrew S. Tanebaum with contributions from James R. Goodman, "Structured Computer Organization", 1999, Prentice Hall, Fourth Edition, pp. 264-288, 359-362.

U.S. Appl. No. 13/049,798: "Capacitance to Code Converter With Sigma-Delta Modulator," Kremin, filed Mar. 16, 2011; 77 pages.

U.S. Appl. No. 11/493,350: "Technique for Increasing the Sensitivity of Capacitive Sensor Arrays," Lee et al., filed Jul. 25, 2006; 48 pages.

U.S. Appl. No. 11/600,255: "Capacitance to Code Converter With Sigma-Delta Modulator," Kremin, filed Nov. 14, 2006; 102 pages.

U.S. Appl. No. 11/709,866: "Input/Output Multiplexer Bus," Dennis R. Sequine, filed Feb. 21, 2007; 33 pages.

U.S. Appl. No. 11/709,897: "Preventing Unintentional Activation of a Sensor Element of a Sensing Device," Jason Konstas; filed Feb. 21, 2007; 97 pages.

U.S. Appl. No. 11/823,982: "Capacitance Measurement Systems and Methods" Louis Bokma et al., filed Jun. 29, 2007; 24 pages.

U.S. Appl. No. 12/167,100 "Capacitive Field Sensor With Sigma-Delta Modulator" Victor Kremin et al., filed Jul. 2, 2008; 39 pages.

U.S. Appl. No. 12/197,466: "Radical Oxidation Process for Fabricating a Nonvolatile Charge Trap Memory Device," Ramkumar et al., filed Aug. 25, 2008; 68 pages.

U.S. Appl. No. 12/239,692 "System and Method to Measure Capacitance of Capacitive Sensor Array" Nathan Moyal et al., filed Sep. 26, 2008; 34 pages.

U.S. Appl. No. 12/332,980: "Compensation Circuit for a TX-RX Capacitive Sensor," Andriy Maharyta, filed Dec. 11, 2008; 55 pages.

U.S. Appl. No. 12/380,141: "Capacitive Field Sensor With Sigma-Delta Modulator", Rystun et al., filed Feb. 23, 2009, 48 pages.

U.S. Appl. No. 12/395,462: "Methods and Circuits for Measuring Mutual and Self Capacitance," Andriy Maharyta, filed Feb. 27, 2009; 44 pages.

U.S. Appl. No. 12/395,969: "Multi-Touch Sensing Method," Dana Olson, filed Mar. 2, 2009; 22 pages.

U.S. Appl. No. 12/606,147: "Methods and Circuits for Measuring Mutual and Self Capacitance," Andriy Maharyta, filed Oct. 26, 2009; 49 pages.

U.S. Appl. No. 12/618,661: "Automatic Tuning of a Capacitive Sensing Device," Dana Olson, filed Nov. 13, 2009; 30 pages.

U.S. Appl. No. 12/861,812 "Capacitance Measurement Systems and Methods", filed Aug. 23, 2010, 24 Pages.

U.S. Appl. No. 13/047,035: "Apparatus and Method for Reducing Average Scan Rate to Detect a Conductive Object on a Sensing Device," Tao Peng, filed Mar. 14, 2011; 64 pages.

U.S. Appl. No. 13/047,270: "Touch Detection Techniques for Capacitive Touch Sense Systems," Louis Bokma, filed Mar. 14, 2011; 34 pages.

(56) References Cited

OTHER PUBLICATIONS

U.S. Appl. No. 13/047,620: "Touch Detection Techniques for Capacitive Touch Sense Systems", filed Mar. 14, 2011, 38 pages.
U.S. Appl. No. 13/191,806: "Capacitance Measurement Systems and Methods", filed Jul. 27, 2011, 38 pages.
U.S. Appl. No. 13/306,840: "Input/Output Multiplexer Bus," Dennis R. Seguine, filed Nov. 29, 2011; 24 pages.
U.S. Appl. No. 13/345,504 "Compensation Circuit for a TX-RX Capacitive Sensor", filed Jan. 6, 2012, 56 pages.
U.S. Appl. No. 13/612,803: "Capacitive Field Sensor with Sigma-Delta Modulator," Andriy Ryshtun, filed Sep. 12, 2012; 56 pages.
U.S. Appl. No. 13/670,671: "System and Method to Measure Capacitance of Capacitive Sensor Array," Nathan Y. Moyal, filed Nov. 7, 2012; 40 pages.
U.S. Appl. No. 13/720,861: "Methods and Circuits for Measuring Mutual and Self Capacitance" Andriy Maharyta et al., filed Dec. 19, 2012; 38 pages.
U.S. Appl. No. 13/889,224: "Noise resistant capacitive sensor," Viktor Kremin, filed May 7, 2013; 39 pages.
U.S. Appl. No. 13/917,528: "Capacitance to Code Converter With Sigma-Delta Modulator" Viktor Kremin, Lviv et al., filed Jun. 13, 2013; 78 pages.
U.S. Appl. No. for 13/342,942 "Capacitive Field Sensor With Sigma-Delta Modulator", filed Jan. 3, 2012, 37 pages.
Chapweske, Adam; "The PS/2 Mouse Interface," PS/2 Mouse Interfacing, 2001, retrieved on May 18, 2006; 11 pages.
Chris Mack, "Semiconductor Lithography—The Basic Process," Gentleman Scientist, downloaded Apr. 20, 2006, http://www.lithoguru.com/scientist/lithobasics.html; 12 pages.
Cypress Semiconductor Corporation, "CY8C21x34 Data Sheet," CSR User Module, CSR V.1.0; Oct. 6, 2005; 36 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes sm017," Jan. 24, 2007; 3 pages.
Dave Van Ess, "Understanding Switched Capacitor Analog Blocks," Application Note AN2041, Mar. 30, 2004; 16 pages.
Dennis Seguine, "Capacitive Switch Scan," AN2233a, Application Note, CY8C21x34, Apr. 7, 2005; 6 pages.
Golub, V., Sigma-delta ADC's, Publication date Jun. 17, 2003, 10 pages.
International Search Report for International Application No. PCT/US05/23468 dated Aug. 25, 2006; 2 pages.
International Search Report for International Application No. PCT/US08/13622 dated Feb. 9, 2009; 2 pages.
International Written Opinion of the International Searching Authority, dated Feb. 9, 2009 for International Application No. PCT/US2008/013622; 5 pages.
Janusz Mlodzianowski, "A Simple Multipurpose Logic Analyzer," Dec. 1997, Circuit Cellar Ink, Issue 89, pp. 28-36.
Kremin, V. "Noise resistant capacitive sensor," U.S. Appl. No. 11/824,4249, filed Jun. 29, 2007; 41 pages.
Larry K. Baxter, "Capactive Sensors, Design and Applications," IEEE Press, The Institute of Electrical and Electronics Engineers Inc., Aug. 1996, pp. 177-187; 12 pages.
Lee, Mark; "EMC Design Considerations for PSoC CapSense Applications," Cypress Semiconductor Corporation, Application Note AN2318; Sep. 16, 2005; 6 pages.

USPTO Non-Final Rejection for U.S. Appl. No. 11/824,249 dated Sep. 26, 2012; 11 pages.
USPTO Notice of Allowance for U.S. Appl. No. 12/395,462 dated Aug. 29, 2012; 5 pages.
USPTO Notice of Allowance for U.S. Appl. No. 12/395,462 dated Oct. 2, 2012; 5 pages.
USPTO Notice of Allowance for U.S. Appl. No. 12/395,462 dated Nov. 14, 2012; 5 pages.
USPTO Notice of Allowance for U.S. Appl. No. 13/047,035 dated Feb. 6, 2013; 9 pages.
USPTO Notice of Allowance for U.S. Appl. No. 13/047,035 dated Dec. 14, 2012; 12 pages.
USPTO Notice of Allowance for U.S. Appl. No. 13/047,620 dated Jun. 8, 2012; 5 pages.
USPTO Notice of Allowance for U.S. Appl. No. 13/301,764 dated Oct. 4, 2012; 58 pages.
USPTO Notice of Allowance for U.S. Appl. No. 13/612,803 dated Aug. 21, 2013; 9 pages.
USPTO Notice of Allowance for U.S. Appl. No. 13/612,806 dated May 2, 2013; 8 pages.
USPTO Notice of Allowance for U.S. Appl. No. 13/629,437 dated Dec. 10, 2012; 8 pages.
USPTO Notice of Allowance for U.S. Appl. No. 13/664,421 dated Feb. 21, 2013; 7 pages.
USPTO Notice of Allowance for U.S. Appl. No. 13/664,421 dated Jun. 14, 2013; 9 pages.
USPTO Notice of Allowance for U.S. Appl. No. 13/664,421 dated Aug. 20, 2013; 9 pages.
USPTO Notice of Allowance for U.S. Appl. No. 13/720,861 dated Jan. 30, 2014; 8 pages.
USPTO Notice of Allowance, U.S. Appl. No. 11/601,465, dated Apr. 22, 2010, 41 pages.
USPTO Notice of Allowance, U.S. Appl. No. 11/601,465, dated Jun. 28, 2011, 21 pages.
USPTO Notice of Allowance, U.S. Appl. No. 11/601,465, dated Aug. 10, 2010, 17 pages.
USPTO Notice of Allowance, U.S. Appl. No. 11/601,465, dated Nov. 26, 2010, 16 pages.
USPTO Notice of Allowance, U.S. Appl. No. 11/729,818, dated Jan. 26, 2011, 12 pages.
USPTO Notice of Allowance, U.S. Appl. No. 11/729,818, dated May 9, 2011, 8 pages.
USPTO Notice of Allowance, U.S. Appl. No. 11/729,818, dated Jun. 9, 2011, 13 pages.
USPTO Notice of Allowance, U.S. Appl. No. 11/729,818, dated Oct. 5, 2010, 33 pages.
USPTO Notice of Allowance, U.S. Appl. No. 11/729,818, dated Jun. 25, 2010, 7 pages.
USPTO Requirement for Restriction for U.S. Appl. No. 12/167,100 dated Aug. 20, 2010; 6 pages.
USPTO Requirement for Restriction for U.S. Appl. No. 12/239,692 dated Sep. 27, 2010; 7 pages.
USPTO Requirement for Restriction for U.S. Appl. No. 12/380,141 dated Jul. 8, 2011; 6 pages.
USPTO Requirement for Restriction for U.S. Appl. No. 12/395,462 dated May 13, 2011; 6 pages.
USPTO Requirement for Restriction for U.S. Appl. No. 13/380,141 dated Jul. 8, 2011; 6 pages.
USPTO Requirement for Restriction/Election for U.S. Appl. No. 11/337,272 dated Sep. 11, 2006; 5 pages.
USPTO Requirement Restriction for U.S. Appl. No. 11/824,249 dated Feb. 17, 2011; 5 pages.
USPTO Restriction Requirement, U.S. Appl. No. 11/601,465, dated Nov. 1, 2007, 5 pages.
USPTO Restriction Requirement, U.S. Appl. No. 13/047,620, dated Feb. 27, 2012, 7 pages.
Van Ess, David; "Simulating a 555 Timer with PSoC," Cypress Semiconductor Corporation, Application Note AN2286, May 19, 2005; 10 pages.
Vladislav Golub, Ph.D., "Sigma-Delta ADCs", pub. date: Jun. 17, 2003, 10 pages.

(56) References Cited

OTHER PUBLICATIONS

Wikipedia, The Free Encyclopedia, "IBM PC Keyboard," <http://en.wikipedia.org/wiki/PC_keyboard> accessed May 19, 2006; 3 pages.
Written Opinion of the International Searching Authority for International Application No. PCT/US08/06627 mailed Aug. 26, 2008; 5 pages.
Written Opinion of the International Searching Authority for International Application No. PCT/US08/13622 mailed Feb. 9, 2009; 5 pages.
Written Opinion of the International Searching Authority for International Application No. PCT/US08/60696 mailed Sep. 22, 2008; 4 pages.
USPTO Final Rejection for U.S. Appl. No. 11/824,249 dated Dec. 22, 2011; 10 pages.
USPTO Final Rejection for U.S. Appl. No. 11/983,291 dated Aug. 12, 2009; 10 pages.
USPTO Final Rejection for U.S. Appl. No. 12/040,387 dated Nov. 21, 2011; 13 pages.
USPTO Final Rejection for U.S. Appl. No. 12/166,228 dated Jan. 4, 2011; 9 pages.
USPTO Final Rejection for U.S. Appl. No. 12/166,228 dated May 28, 2010; 12 pages.
USPTO Final Rejection for U.S. Appl. No. 12/239,692 dated May 9, 2011; 10 pages.
USPTO Final Rejection for U.S. Appl. No. 12/332,980 dated May 31, 2011; 11 pages.
USPTO Final Rejection for U.S. Appl. No. 12/367,279 dated Apr. 1, 2010; 6 pages.
USPTO Final Rejection for U.S. Appl. No. 12/395,462 dated Jan. 3, 2012; 6 pages.
USPTO Final Rejection for U.S. Appl. No. 12/395,969 dated Jul. 17, 2012; 25 pages.
USPTO Final Rejection for U.S. Appl. No. 12/861,812 dated Oct. 18, 2011; 16 pages.
USPTO Final Rejection for U.S. Appl. No. 13/591,145 dated Apr. 3, 2013; 17 pages.
USPTO Final Rejection for U.S. Appl. No. 13/591,145 dated Oct. 3, 2013; 16 pages.
USPTO Final Rejection for U.S. Appl. No. 13/720,861 dated May 14, 2013; 7 pages.
USPTO Final Rejection for U.S. Appl. No. 13/720,861 dated Aug. 2, 2013; 9 pages.
USPTO Non Final Rejection for U.S. Appl. No. 11/823,982 dated Mar. 19, 2009; 14 pages.
USPTO Non Final Rejection for U.S. Appl. No. 11/824,249 dated Sep. 26, 2012; 11 pages.
USPTO Non Final Rejection for U.S. Appl. No. 12/166,228 dated Aug. 11, 2010; 8 pages.
USPTO Non Final Rejection for U.S. Appl. No. 12/166,228 dated Dec. 30, 2009; 11 pages.
USPTO Non Final Rejection for U.S. Appl. No. 12/380,141 dated Jan. 29, 2013; 6 pages.
USPTO Non Final Rejection for U.S. Appl. No. 12/395,969 dated Dec. 19, 2013; 31 pages.
USPTO Non Final Rejection for U.S. Appl. No. 13/049,556 dated Jun. 13, 2013; 11 pages.
USPTO Non Final Rejection for U.S. Appl. No. 13/049,556 dated Oct. 18, 2013; 10 pages.
USPTO Non Final Rejection for U.S. Appl. No. 13/301,764 dated Apr. 11, 2012; 6 pages.
USPTO Non Final Rejection for U.S. Appl. No. 13/720,861 dated Mar. 11, 2013; 9 pages.
USPTO Non Final Rejection for U.S. Appl. No. 13/917,528 dated Nov. 15, 2013; 12 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
USPTO Non-Final Rejection for U.S. Appl. No. 11/230,719 dated Jan. 16, 2007; 8 pages.
USPTO Non-Final Rejection for U.S. Appl. No. 11/230,719 dated May 11, 2006; 5 pages.
USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2006; 7 pages.
USPTO Non-Final Rejection for U.S. Appl. No. 11/273,708 dated Mar. 19, 2007; 16 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/395,417 dated Apr. 25, 2008; 7 pages.
USPTO Non-Final Rejection for U.S. Appl. No. 11/395,417 dated Oct. 26, 2006; 13 pages.
USPTO Non-Final Rejection for U.S. Appl. No. 11/395,417 dated Nov. 1, 2007; 8 pages.
USPTO Non-Final Rejection for U.S. Appl. No. 11/437,517 dated Aug. 3, 2010; 10 pages.
USPTO Non-Final Rejection for U.S. Appl. No. 11/437,517 dated Aug. 5, 2009; 9 pages.
USPTO Non-Final Rejection for U.S. Appl. No. 11/442,044 dated Mar. 31, 2009; 12 pages.
USPTO Non-Final Rejection for U.S. Appl. No. 11/442,212 dated Feb. 25, 2011; 13 pages.
USPTO Non-Final Rejection for U.S. Appl. No. 11/442,212 dated Jul. 6, 2010; 13 pages.
USPTO Non-Final Rejection for U.S. Appl. No. 11/477,179 dated Jun. 9, 2009; 13 pages.
USPTO Non-Final Rejection for U.S. Appl. No. 11/477,179 dated Jul. 20, 2010; 10 pages.
USPTO Non-Final Rejection for U.S. Appl. No. 11/477,179 dated Nov. 18, 2009; 10 pages.
USPTO Non-Final Rejection for U.S. Appl. No. 11/484,085 dated Sep. 17, 2009; 8 pages.
USPTO Non-Final Rejection for U.S. Appl. No. 12/395,969 dated Feb. 8, 2013; 24 pages.
USPTO Non-Final Rejection for U.S. Appl. No. 13/049,556 dated Jan. 25, 2013; 11 pages.
Mark Lee, "CapSense Best Practices," Cypress Application Note AN2394; Oct. 19, 2006; 10 pages.
Milton Ohring, "The Materials Science of Thin Films: Deposition and Structure," 2nd Edition, Academic Press, 2002, pp. 336-337; 4 pages.
Min et al., "Offset Compensation of Capacitive Sensors for Electrostatic Microactuators," ISIE 2001, Pusan Korea, pp. 2114-2117.
Ryan Seguine et al., "Layout Guidelines for PSoC CapSense", Cypress Application Note AN2292, Revision B, Oct. 31, 2005, pp. 1-15.
Ryan Seguine, "Capacitive Front Panel Display Demonstration" Cypress Semiconductor Application Note, AN2277, Oct. 20, 2005, 7 pages.
Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; Jul. 22, 2005; 13 pages.
SIPO 1st Office Action for Application No. 200880120802.9 dated Jan. 8, 2013; 6 pages.
SIPO 1st Office Action for Application No. 200880120802.9 dated Nov. 5, 2012; 6 pages.
Ted Tsui, "Migrating from CSR to CSD," Cypress Semiconductor Corporation, Application Note AN2408, Feb. 8, 2007, http://www.cypress.com.
The Authoritative Dictionary of IEEE Standards Terms, 2000, IEEE Press Publications, 7th Edition, pp. 1133-1134; 4 pages.

(56) References Cited

OTHER PUBLICATIONS

The Written Opinion of the International Searching Authority for International Application No. PCT/US05/23468 dated Aug. 25, 2006; 7 pages.
USPTO Advisory Action for U.S. Appl. No. 11/230,719 dated Nov. 30, 2007; 3 pages.
USPTO Advisory Action for U.S. Appl. No. 11/337,272 dated Apr. 3, 2007; 3 pages.
USPTO Advisory Action for U.S. Appl. No. 11/395,417 dated Jul. 6, 2007; 3 pages.
USPTO Advisory Action for U.S. Appl. No. 11/437,517 dated Apr. 7, 2010; 3 pages.
USPTO Advisory Action for U.S. Appl. No. 11/442,212 dated Jan. 5, 2011; 3 pages.
USPTO Advisory Action for U.S. Appl. No. 11/442,212 dated Dec. 17, 2009; 3 pages.
USPTO Advisory Action for U.S. Appl. No. 11/477,179 dated Jun. 7, 2010; 3 pages.
USPTO Advisory Action for U.S. Appl. No. 11/512,042 dated Feb. 23, 2011; 3 pages.
USPTO Advisory Action for U.S. Appl. No. 12/332,980 dated Aug. 9, 2011; 3 pages.
USPTO Advisory Action for U.S. Appl. No. 12/367,279 dated Jun. 25, 2010; 3 pages.
USPTO Advisory Action for U.S. Appl. No. 12/395,462 dated Mar. 28, 2012; 2 pages.
USPTO Advisory Action for U.S. Appl. No. 12/395,969 dated Oct. 29, 2013; 4 pages.
USPTO Advisory Action for U.S. Appl. No. 13/591,145 dated Jun. 13, 2013; 3 pages.
USPTO Advisory Action for U.S. Appl. No. 13/591,145 dated Jul. 9, 2013; 3 pages.
USPTO Advisory Action for U.S. Appl. No. 13/720,861 dated Sep. 18, 2013; 3 pages.
U.S. Appl. No. 13/664,421: "Methods and Circuits for Measuring Mutual and Self Capacitance" Andriy Maharyta et al., filed Oct. 31, 2012; 51 pages.
USPTO Final Rejection for U.S. Appl. No. 09/975,105 dated Jul. 13, 2006; 7 pages.
USPTO Final Rejection for U.S. Appl. No. 11/230,719 dated Sep. 7, 2007; 9 pages.
USPTO Final Rejection for U.S. Appl. No. 11/273,708 dated Jul. 5, 2007; 8 pages.
USPTO Final Rejection for U.S. Appl. No. 11/337,272 dated Feb. 2, 2007; 11 pages.
USPTO Final Rejection for U.S. Appl. No. 11/395,417 dated Apr. 24, 2007; 9 pages.
USPTO Final Rejection for U.S. Appl. No. 11/437,517 dated Jan. 26, 2010; 11 pages.
USPTO Final Rejection for U.S. Appl. No. 11/442,212 dated Jun. 7, 2011; 14 pages.
USPTO Final Rejection for U.S. Appl. No. 11/442,212 dated Oct. 2, 2009; 12 pages.
USPTO Final Rejection for U.S. Appl. No. 11/442,212 dated Oct. 13, 2010; 13 pages.
USPTO Final Rejection for U.S. Appl. No. 11/477,179 dated Apr. 1, 2010; 10 pages.
USPTO Final Rejection for U.S. Appl. No. 11/477,179 dated Nov. 24, 2010; 10 pages.
USPTO Final Rejection for U.S. Appl. No. 11/484,085 dated Mar. 16, 2010; 7 pages.
USPTO Final Rejection for U.S. Appl. No. 11/502,267 dated Feb. 3, 2009; 10 pages.
USPTO Final Rejection for U.S. Appl. No. 11/512,042 dated Dec. 21, 2010; 7 pages.
USPTO Final Rejection for U.S. Appl. No. 11/600,896 dated Sep. 30, 2010; 19 pages.
USPTO Final Rejection for U.S. Appl. No. 11/601,465 dated Mar. 6, 2009; 11 pages.
USPTO Final Rejection for U.S. Appl. No. 11/601,465 dated Jul. 9, 2008; 10 pages.
USPTO Final Rejection for U.S. Appl. No. 11/709,897 dated Jul. 29, 2010; 24 pages.
USPTO Final Rejection for U.S. Appl. No. 11/729,818 dated Jul. 2, 2009; 14 pages.
USPTO Non-Final Rejection for U.S. Appl. No. 12/040,387 dated Jun. 30, 2011; 12 pages.
USPTO Notice of Allowance for U.S. Appl. No. 12/040,387 dated Jan. 28, 2013; 8 pages.
USPTO Notice of Allowance for U.S. Appl. No. 12/040,387 dated Mar. 1, 2013; 8 pages.
USPTO Notice of Allowance for U.S. Appl. No. 12/040,387 dated Mar. 29, 2012; 8 pages.
USPTO Notice of Allowance for U.S. Appl. No. 12/040,387 dated Jul. 8, 2013; 9 pages.
USPTO Notice of Allowance for U.S. Appl. No. 12/040,387 dated Nov. 8, 2012; 9 pages.

\* cited by examiner

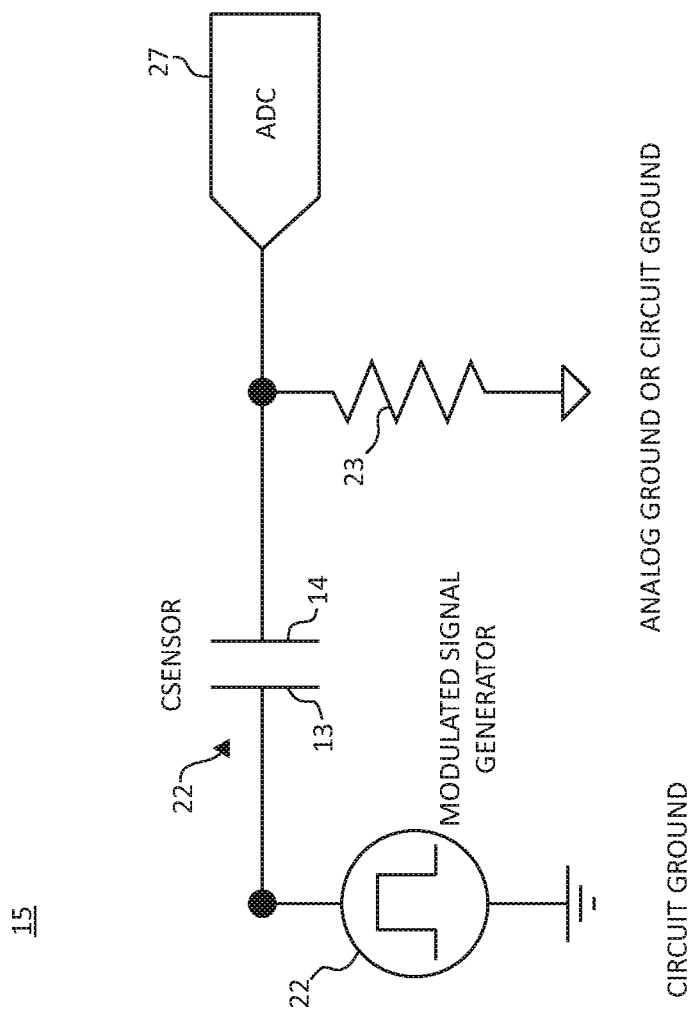

TOUCH SENSING

CROSS REFERENCE TO RELATED APPLICATIONS

This application is a continuation of U.S. patent application Ser. No. 12/040,387, filed Feb. 29, 2008, which claims the priority benefit of U.S. provisional application no. 61/023,988, filed Jan. 28, 2008, each of which is incorporated herein by reference in its entirety for all purposes.

TECHNICAL FIELD

The present disclosure relates generally to user interfaces utilizing capacitive sensing.

BACKGROUND

User interfaces utilizing capacitive sensing include circuitry for detecting a capacitance change when a finger or other object is adjacent to a touch screen, touch pad, series of touch buttons, or other touch panel. The FIG. 1 shows an example electrode grid array 1 (also known as an electrode matrix) used by a touch sense device having a touch pad.

The array 1 includes rows 3 and columns 4 of electrodes overlaid by a dielectric (not shown). A charge is applied to both of the electrodes 3 and 4 by circuits 5 such that, if a finger or other conductive object is placed on the touch panel, the finger or other object increases capacitive coupling to ground.

The change in capacitance caused by the finger touching the touch panel can be detected by circuits 5 coupled to the electrodes 3 and 4. Ones of the circuits 5 that correspond to ones of the electrodes 3 and 4 that are closest to the finger measure different capacitance than the remaining circuits 5. These capacitive measurements can be used to identify which intersection of the electrodes 3 and the column electrodes 4 is closest to the finger, which can be used to pinpoint the position of the finger. This process is dynamic as the finger changes positions on the touch panel allowing the touch sense device to, for example, move a mouse pointer on a display to correspond with the finger movement.

The circuits 5 do not have the ability to resolve multiple presses, i.e. more than position on the touch panel are being touched simultaneously, or nearly simultaneously. The disclosure that follows solves this and other problems.

SUMMARY OF THE INVENTION

In one embodiment, an apparatus comprises a plurality of capacitors, each having a first electrode and a second electrode. The apparatus includes charging circuitry coupled to the first electrodes and sensing circuitry coupled to the second electrodes, the sensing circuitry configured to detect changes in capacitance across the capacitors responsive to movement of an input object relative to the apparatus. Interpolating circuitry identifies which one of the capacitors is nearest to the input object according to the detected capacitance changes.

The apparatus can also include multiplexing circuitry electrically interposed between the first electrodes and the charge circuitry, the multiplexing circuitry alternating which one of the first electrodes is electrically coupled to the charge generation circuitry according to a time division scheme.

The charge circuitry can include a pseudo random signal generator to provide a signal driving the first electrodes. The pseudo random signal generator provides a reference signal to a demodulator that is connected to the second electrodes. The demodulator demodulates a signal corresponding to the second electrodes according to the reference frequency generated by the pseudo random signal generator. A low pass filter to can be used to filter the output of the demodulator. An analog to digital converter can be used to sample the output of the low pass filter.

The apparatus can be coupled to a graphical user interface or other interface that allows a user to adjust at least one characteristic of circuit components used in the sensing circuitry and/or charge circuitry. The adjusted characteristics can be selected from the group comprising the center frequency of a pseudo random signal generator, a sampling rate of the analog to digital converter, and an operating characteristic of a low pass filter.

BRIEF DESCRIPTION OF THE DRAWINGS

FIG. 6 illustrates another example of the sensing circuitry shown in FIG. 3.

DESCRIPTION OF EXAMPLE EMBODIMENTS

Figure 1:
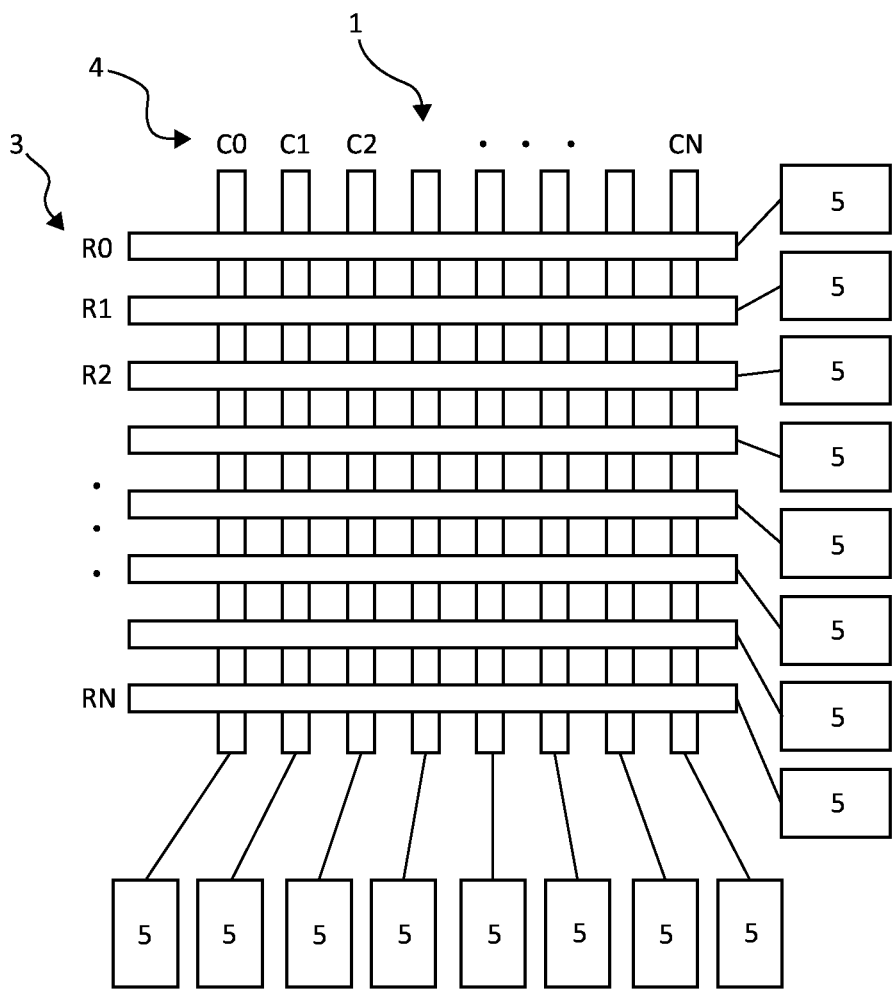
FIG. 1 illustrates an electrode grid array used by a typical touch sense device.

Several preferable examples of the present application will now be described with reference to the accompanying drawings. Various other examples of the invention are also possible and practical. This application may be exemplified in many different forms and should not be construed as being limited to the examples set forth herein.

The figures listed above illustrate preferable examples of the application and the operation of such examples. In the figures, the size of the boxes is not intended to represent the size of the various physical components. Where the same element appears in multiple figures, the same reference numeral is used to denote the element in all of the figures where it appears. When two elements operate differently, different reference numerals are used regardless of whether the two elements are of the same class.

Only those parts of the various units are shown and described which are necessary to convey an understanding of the examples to those skilled in the art. Those parts and elements not shown may be conventional and known in the art.

Figure 2A:
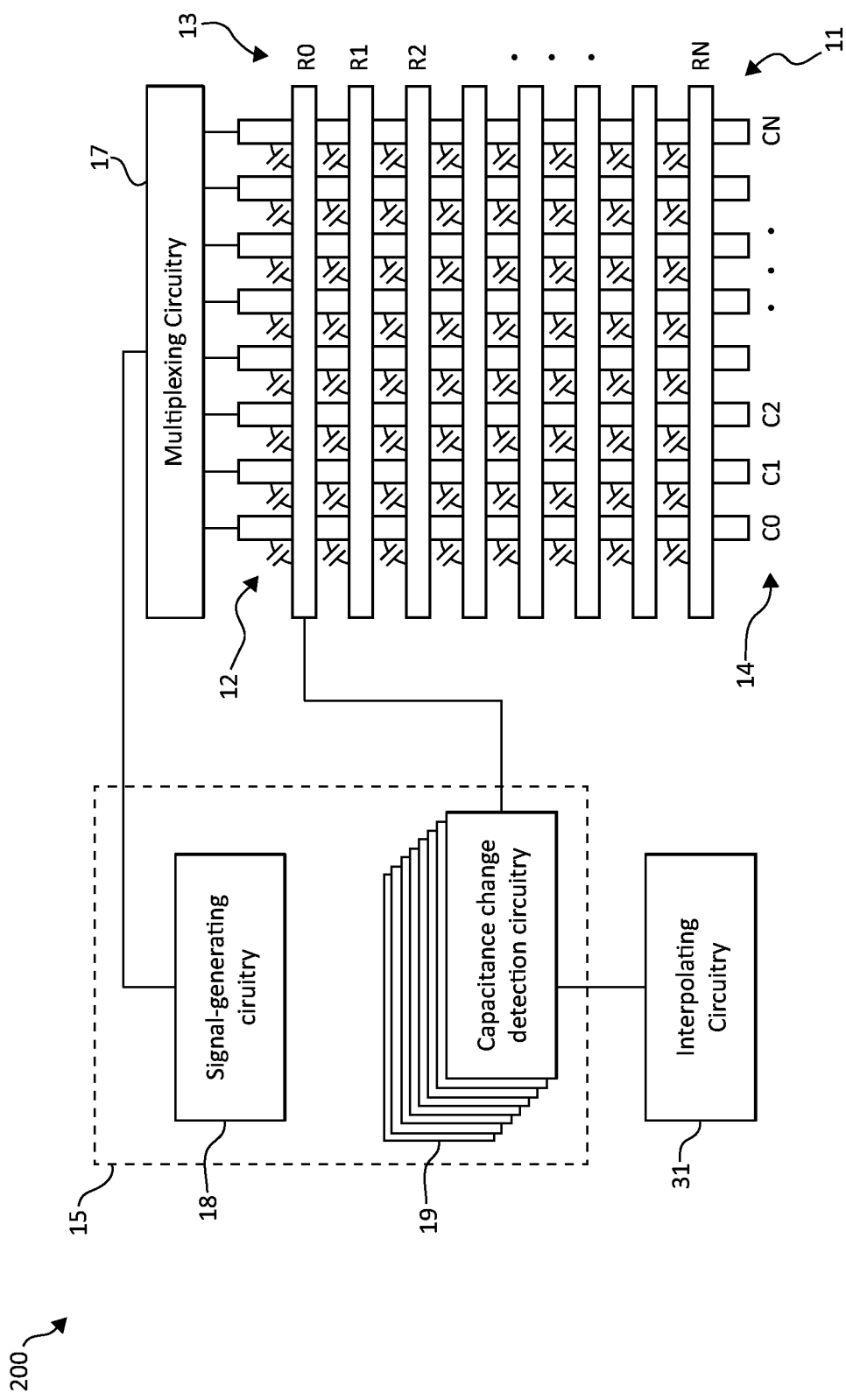
FIG. 2A illustrates an apparatus to measure capacitance occurring at a junction point in an electrode grid array.

FIG. 2A illustrates an apparatus to measure capacitance occurring at a junction point in an electrode grid array.

The apparatus 200 includes sensing circuitry 15 to identify changing capacitance between the row and column electrodes 13 and 14 of the electrode grid array 11. What follows below with reference to FIG. 2A is an overview of one example of the sensing circuitry 15; a more detailed overview of the sensing circuitry 15 will be provided later with reference to other figures.

The sensing circuitry 15 includes signal generating circuitry 18, which provides a charge to the column electrodes 14. The multiplexing circuitry 17 selectively couples the column electrodes 14 to the circuitry 18 such that, at any given instant, the charge is being fed to only one of the column electrodes 14. In the present example, the cycle time for the multiplexing circuitry 17 is sixteen milliseconds, meaning that after sixteen milliseconds every column electrode 14 has received the charge. This sixteen millisecond cycle time can be different for other examples, and is hereinafter referred to as the "cycle time". Although the charge is fed to the column electrodes 13 one at a time in the present example, other schemes whereby more than one column electrode 13 is charged at any given instant are also possible and practical. Although the charge is fed to the column electrodes 14 in the present example, it should be apparent that in other examples the charge could instead be fed to the row electrodes 13. During a cycle, unselected electrodes may be driven to a fixed potential, such as a circuitry ground.

In the present example, the sensing circuitry 15 also includes one instance of capacitive change detection circuitry 19 for each row electrode 13. For ease of illustration, only one of the instances of the circuitry 19 is connected to one row electrode, namely row electrode R0, but it should be apparent that connections exist between the other circuits 19 and the other row electrodes 13. As illustrated by each of the capacitor symbols 12 between each row/column junction, the circuitry 19 detects changes in capacitance between the corresponding row and column electrodes 13 and 14. For example, as a finger or other capacitive surface approaches the column electrode C0, one or more of the circuits 19 will detect a decrease in voltage and an increase in capacitance. Generally speaking, whichever one of the circuits 19 measures the greatest capacitive change is connected to the row electrode 13 closest to the approaching finger. This information, when combined with information about which column electrode 14 is being powered, can be used by interpolating circuitry 31 to determine which intersection of the rows and columns is closest to the finger. In an embodiment, the interpolating circuitry 31 identifies which one of the capacitors is nearest to the finger according to the detected capacitive changes.

Although the present example includes one circuit 19 for each row electrode 13 (parallel sensing), it should be apparent that the sensing can also use a time division multiplexing scheme where a multiplexer selectively connects a single instance of the circuit 19 sequentially through all row electrodes 13 (serial sensing). Also, although the circuits 19 detect the row electrodes 13 in the present example, it should be apparent that in other examples the circuits 19 could instead detect the column electrodes 14.

As described above, measuring capacitance between the row and column electrodes 13 and 14 allows a touch sense device to resolve a change in capacitance at a point, instead of at an entire row or entire column. This feature provides numerous advantages, some of which are described with reference to FIG. 2B.

Figure 2B:
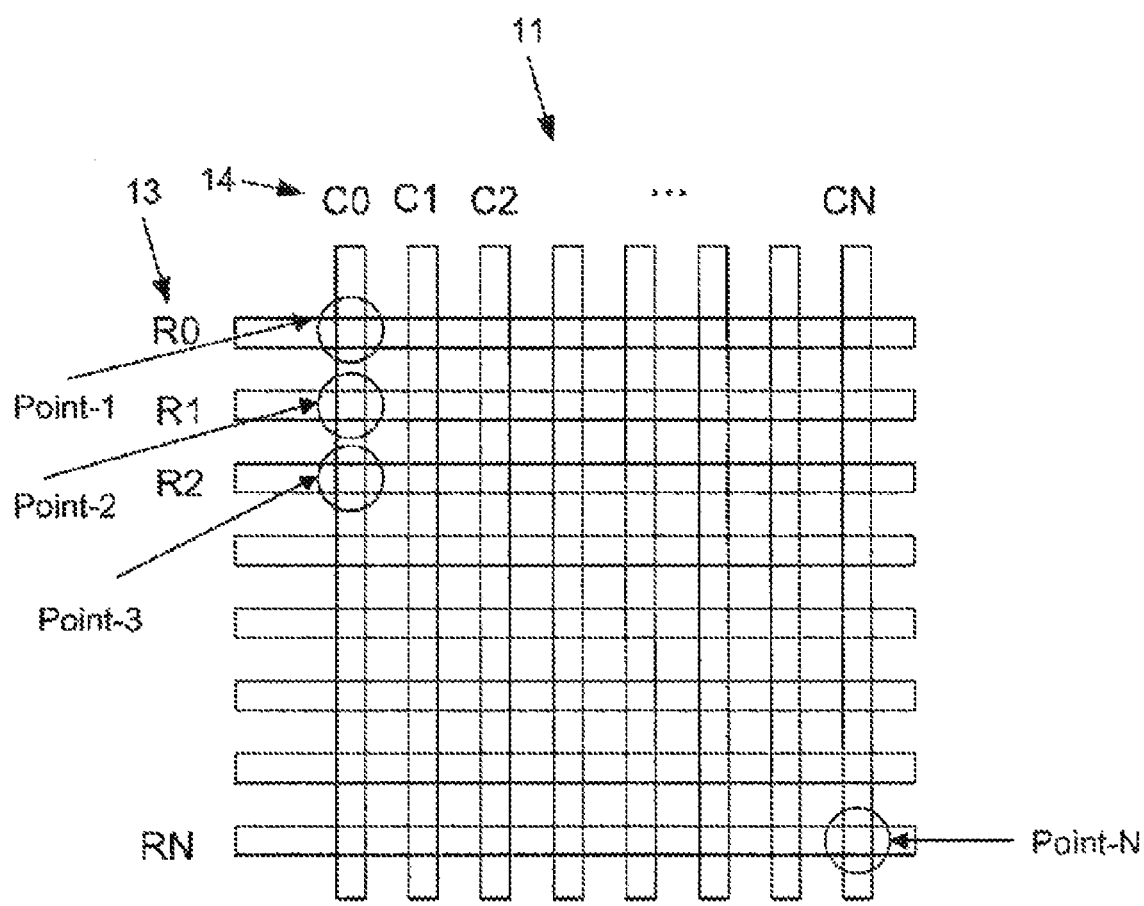
FIG. 2B illustrates a multi-touch capability of the apparatus shown in FIG. 2A.

FIG. 2B illustrates a multi-touch capability of the apparatus shown in FIG. 2A.

Referring now to FIG. 2B, such measurements allow multi-touch sensing. Multi-touch sensing allows, for example, a touch sense device to detect a plurality of finger presses occurring in a single cycle time. For example, a touch sense device using the sensing circuitry 15 can, for example, identify the presence of a finger touching the touchpad at a position corresponding to Point-N while identifying another finger touches the touchpad at a different position at Points 1-3 during a same cycle time. This multi-sense capability enables new applications, such as a touch screen allowing a user to input data using both hands, and a touch screen that is capable of detecting a capacitive image according to differing capacitance measurements.

Besides multi-touch, the sensing circuitry 15 provides other advantages. Point-based capacitance sensing can provide better accuracy than previous sensing that detected capacitive change in entire rows and/or columns Also, point based touch sensing only requires charging one set of the electrodes, not both, which can reduce power consumption.

Figure 3:
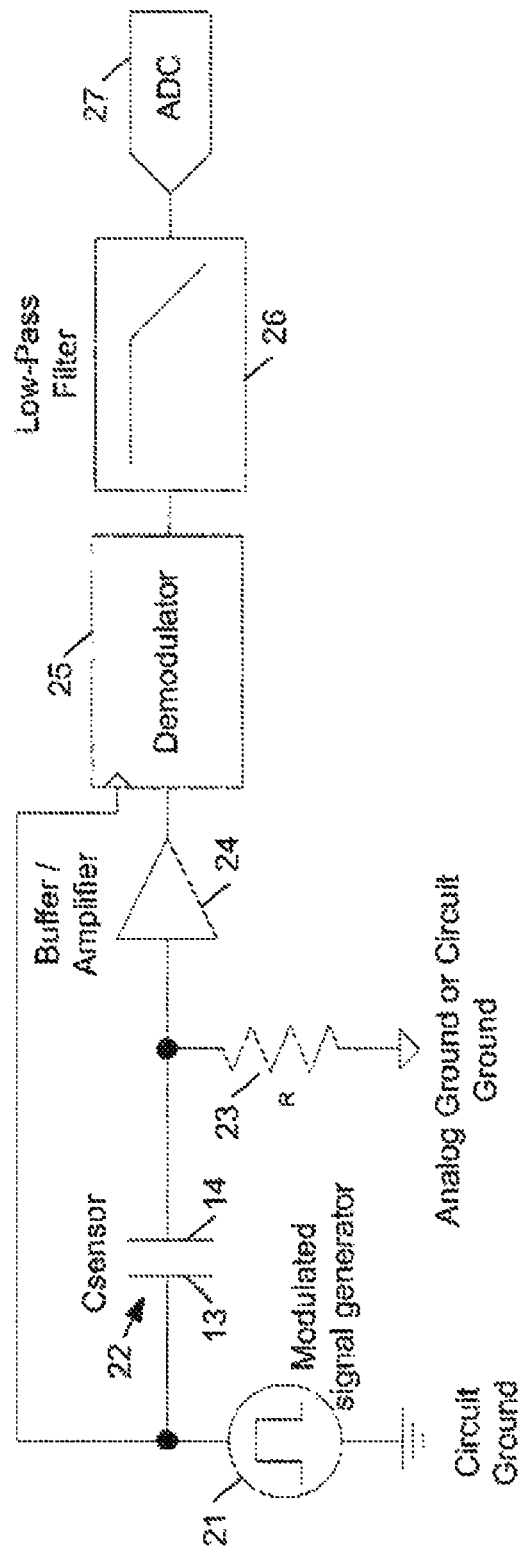
FIG. 3 illustrates one example of the sensing circuitry shown in FIG. 2A.

FIG. 3 illustrates one example of the sensing circuitry shown in FIG. 2.

The sensing circuitry 15 includes a modulated signal generator 21 to drive electrode 13 with an Alternating Current (AC) signal. For reasons that will be explained in greater detail later, preferably a Pseudo Random Signal generator (PRS) is selected as the modulated signal generator 21. Although the generator 21 drives the row electrode 13, in other examples the generator 21 instead drives the column electrode 14.

The signal output by the generator 21 is coupled across the capacitive structure 22, which includes electrodes 13 and 14 and a dielectric layer separating electrodes 13 and 14. The capacitance across the capacitor structure 22 changes according to the presence or absence of a finger on the touchpad adjacent to the electrode 14. For example, when a finger is adjacent to the electrode 14, the coupling to the input stage (the buffer/amplifier) decreases.

The remaining circuit elements 23-27 measure the change in capacitance across the capacitor element 22. The demodulator 25 receives a signal directly from the generator 21, which is used to select a passing frequency for the demodulator 25. For example, when the signal generator 21 outputs a signal at 200 kHz, the demodulator 25 receives such indication and passes 200 kHz signals from the buffer/amplifier 24. Passing the 200 kHz signals (as opposed to all signals) can prevent noise radiated from other circuits near or in the touch sense device from providing false indications of the presence or absence of a finger adjacent to the electrode 14.

The resistor 23 may not be needed depending on the resistance to ground. The ground can be an analog ground or a circuit ground. The low pass filter 26 can be used to remove ripple from the output of the demodulator 25. The Analog to Digital Converter (ADC) 27 can be used to convert the signal into digital form.

Referring again to the signal generator 21, preferably a PRS is used. A PRS operates by varying a pulse width and duty cycle. The output signal varies both in frequency and the amount of time the different frequencies are used. In the present example, the signal generator 21 is a PRS varying around a center frequency of 200 kHz.

As mentioned previously, several advantages are realized by using a PRS for the signal generator 21. Using a pseudo randomly varying signal output, or even a randomly varying signal output, greatly reduces the likelihood of neighboring circuit elements disrupting operation by radiating energy at a same frequency as the sensing element 15. Accordingly, such radiated energy is unlikely to pass the demodulator 25, thereby removing crosstalk. Thus, the use of a PRS instead of non-random signal generators such as a Pulse Code Modulator (PCM) minimizes the possibility of a false indication of the presence or absence of a finger.

Also, the random nature of the PRS minimizes the effect of Electro Magnetic Interference (EMI). When the touch sense device is adjacent or coupled to another electronic component such as a cell phone or Personal Digital Assistant (PDA), this feature can reduce interference with those devices.

It should be apparent that the above benefits may be realized by using any type of varying signal generator 21, whether it is random, pseudo random or otherwise varying intermittently. A Pulse-Width Modulator (PWM) may be used instead of the PRS as an alternate design. It should also be apparent that numerous modifications are possible to the above example circuit, for example it is possible to implement an ADC having the demodulator and the low-pass filter integrated therein.

Figure 4:
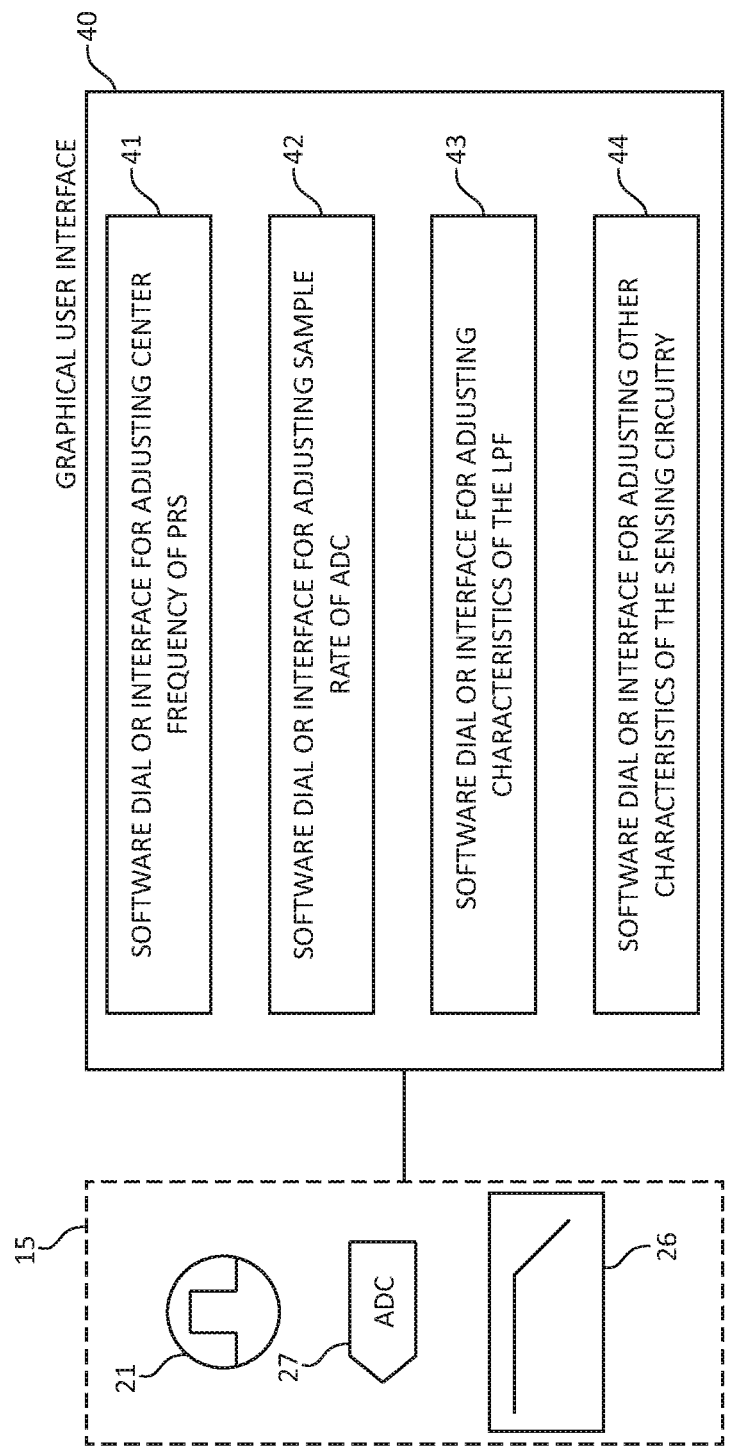
FIG. 4 illustrates a graphical user interface for adjusting the circuitry shown in FIG. 3 to optimize performance with different hardware.

FIG. 4 illustrates a graphical user interface for adjusting the circuitry shown in FIG. 3 to optimize performance with different hardware.

The graphical user interface 40 includes software dials or interfaces 41-44 for adjusting characteristics of the sensing circuitry 15 according to characteristics of hardware used with the sensing circuitry 15. It may be advantageous to manufacture the sensing circuitry 15 as a modularized component that can be used with a wide variety of touch panels and electrode grid arrays. In such a scheme, the graphical interface 40 can be used to adjust the characteristics of the aforementioned PRS 21, the ADC 27, and the LPF 26, as well as any other components of the sensing circuitry. The graphical interface 40 can be displayed on a display attached to a general purpose computer that is connected to the sensing circuitry via a Universal Serial Bus (USB) or other connection.

The interface 41 can be used to adjust the center frequency of the PRS 21. Adjusting the center frequencies can help tune the sensing circuitry 15 to the particular electrode grid array and touch surface to which the sensing circuitry is connected. The amount of distance there is between electrode layers in the electrode array, and the amount of distance there is between the touch surface and the electrodes, may affect an optimal center frequency. The interface 41 can be used to manually test different center frequencies to determine, empirically, which center frequency produces the desired results with the particular hardware.

Also, if the interface 41 can be used to adjust the center frequency to reduce the effect of radiated energy from the sensing circuitry 15 to other unrelated components that may be placed in close physical proximity to the sensing circuitry 15. For example, in a cell phone with a touch panel, the center frequency PRS 21 may need to be adjusted to avoid interference with the cell phone's transceiver.

The interface 42 can be used to adjust the sample rate of the ADC 27 to correspond with the set center frequency of the PRS 21. In most scenarios, a one to one correspondence has been empirically shown to be preferable, e.g. if the center frequency is two hundred Hertz the ADC 27 sample rate should be set to two hundred Hertz. However, it can be advantageous to set the sample rate to be any multiple of the center frequency, for example twice or four times the center frequency, dependent on the hardware characteristics.

The interface 43 can be used to adjust multiple characteristics of the LPF 26, such as the cutoff frequency, whether the LPF 26 provides amplification to the signal, the roll off of the LPF 26, etc. The characteristics of the LPF 26 may be tuned to correspond with circuit characteristics including the center frequency of the PRS 21.

The characteristics of the LPF 26 may also be tuned according to characteristics of the associated touch device. For example, the LPF's 26 cutoff frequency should be tuned below the PRS 21 center frequency. The LPF 26 should not be tuned so low that it restricts the ADC sample rate.

One or more of the additional interfaces 44 can be used to change any other characteristics of the sensing circuitry. Selectively coupling the resistor 23 between ground and analog ground can provide performance differences. For example, using the interface 44 to select an analog ground produces a full wave rectified signal input into the demodulator 25, while using the interface 44 to select a circuit ground produces a half wave rectified input signal. Selecting between these input signals may be helpful depending on the features of the analog to digital converter used. The interface 44 can also be used to vary the value of the resistor 23 based on circuit characteristics, which can affect responsiveness of the circuitry at the price of accuracy, and vice versa.

The software controls 41-44 may allow a user to slide a bar to vary characteristics, turn a software dial, or input numerical values to be used. It should be apparent that, although the present example uses a graphical user interface 40 with software controls 41-44, other examples may utilize physical knobs or other non-software controls to adjust the various characteristics as discussed above.

Figure 5:
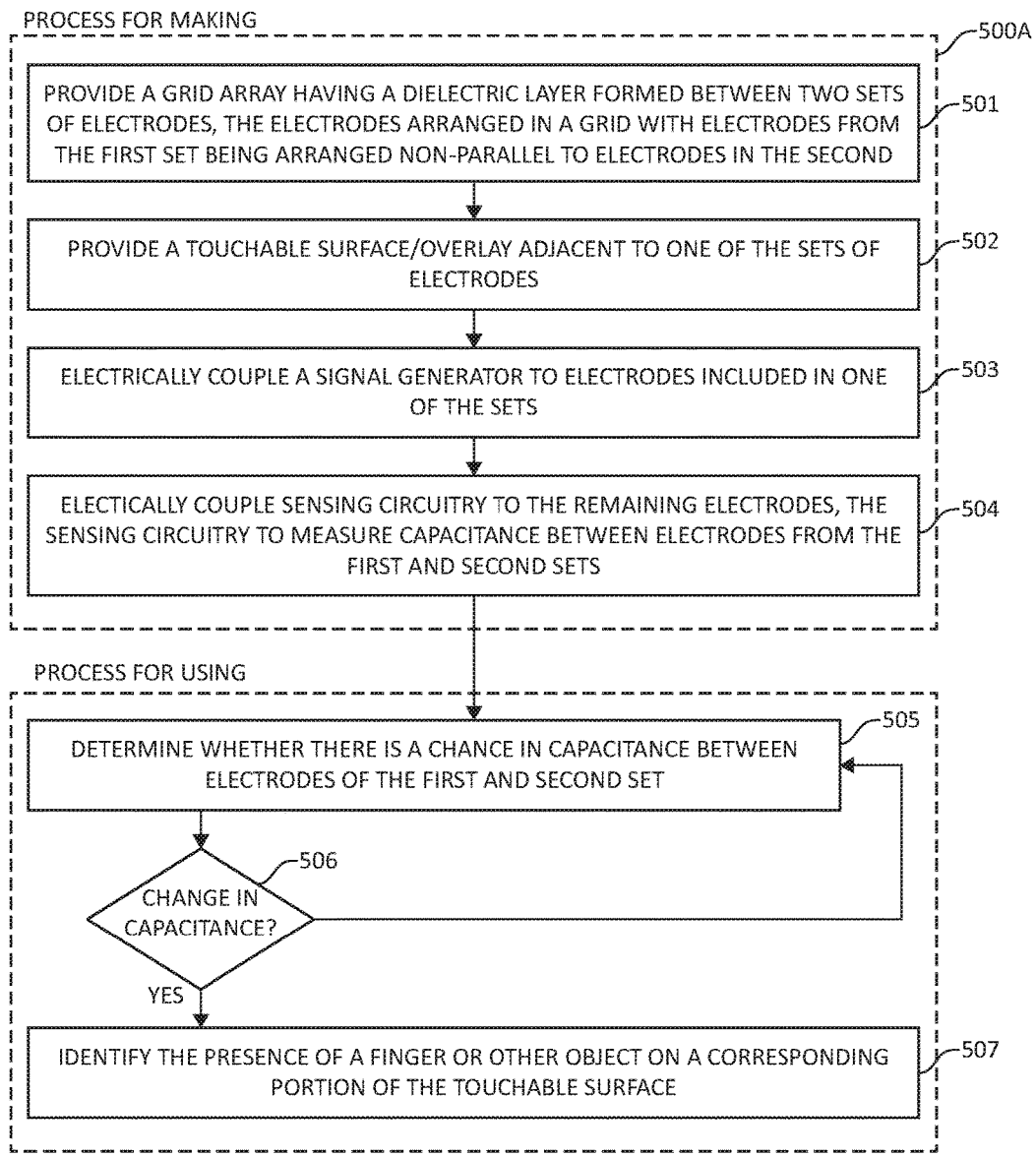
FIG. 5 illustrates a method for assembling and using the apparatus circuitry shown in FIG. 2A.

FIG. 5 illustrates a method for making and using the sensing circuitry shown in FIG. 3.

A process 500A for making the sensing circuitry is illustrated. In block 501, a dielectric layer is formed between two sets of electrodes, the electrodes arranged in a grid with the first set being arranged non-parallel to the second set. In block 502, a touchable surface/overlay or other insulating layer is provided adjacent to one of the electrode sets.

In block 503, a signal generator is electrically coupled to one or more electrodes of one of the sets. The signal generator can be an intermittently varying signal generator, either random or pseudo random, or a signal generator that emits a constant signal. In block 504, the remaining set of electrodes is connected to sensing circuitry to measure capacitance between electrodes from the first and second sets.

A process 500B for using the sensing circuitry includes blocks 505-507. In block 505, the sensing circuitry is used to determine whether there is a change in capacitance between the electrodes of the first and second set. If there is a capacitance change in box 506, in block 507 an interpolating component implemented as circuitry or a processor executing stored instructions identifies the presence of a finger or other object on a corresponding portion of the touchable surface.

FIG. 6 illustrates another example of the sensing circuitry shown in FIG. 3.

The additional example of the sensing circuitry 15 shown in FIG. 3 provides a more simplified circuit whereby the electrode 14 is connected to the ADC 27, with only a pull down resistor 23 positioned between them. This simplified version of the sensing circuitry 15 omits several elements, which reduces costs in exchange for performance. The additional example of the sensing circuitry 15 uses a modulated signal generator 22 instead of the PRS generator.

Figure 7A:
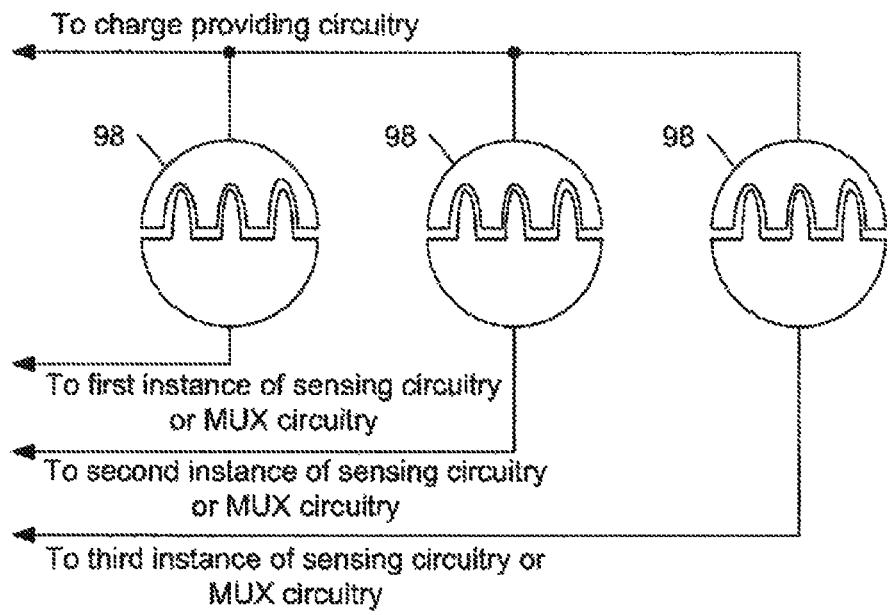
FIGS. 7A and 7B show other capacitor arrangements that can be used with the sensing circuitry of FIG. 3.
Figure 7B:
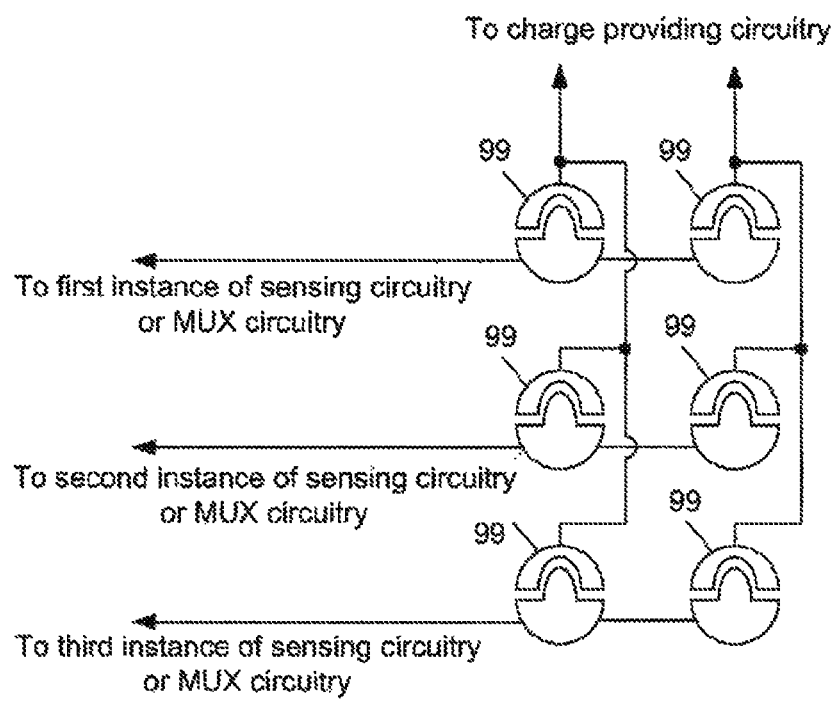

FIGS. 7A and 7B show other capacitor arrangements that can be used with the sensing circuitry of FIG. 3.

In the arrangement shown in FIG. 7A, the capacitors 98 correspond to a touch button device or other touch device besides a trackpad touch device. The capacitors 98 are arranged in a line, which may be referred to as a 1×3 capacitor array having one column and three rows. Each of the capacitors 98 includes one electrode electrically coupled to a charge providing device such as a PRS and another electrode coupled to the sensing circuitry. As a finger or other object approaches the capacitor arrangement, there is a greater capacitive change associated with one of the capacitors 98 than the remaining capacitors. It should be apparent that the electrodes of each capacitor 98 may be directly coupled to the PRS and sensing circuitry, or coupled to the PRS and sensing circuitry through intervening multiplexing circuitry.

In the arrangement shown in FIG. 7A, the capacitors 99 correspond to a touch button device or other touch device besides a trackpad touch device. The capacitors 99 are arranged in a 2×3 capacitor array having two columns and three rows. Each of the capacitors 99 includes one electrode electrically coupled to a charge providing device such as a PRS and another electrode coupled to the sensing circuitry. As a finger or other object approaches the capacitor arrangement, there is a greater capacitive change associated with one of the capacitors 99 than the remaining capacitors. It should be apparent that the electrodes of each capacitor 99 may be directly coupled to the PRS and sensing circuitry, or coupled to the PRS and sensing circuitry through intervening multiplexing circuitry.

Several preferable examples have been described above with reference to the accompanying drawings. Various other examples of the invention are also possible and practical. The system may be exemplified in many different forms and should not be construed as being limited to the examples set forth above.

The figures listed above illustrate preferable examples of the application and the operation of such examples. In the figures, the size of the boxes is not intended to represent the size of the various physical components. Where the same element appears in multiple figures, the same reference numeral is used to denote the element in all of the figures where it appears.

Only those parts of the various units are shown and described which are necessary to convey an understanding of the examples to those skilled in the art. Those parts and elements not shown are conventional and known in the art.

The system described above can use dedicated processor systems, micro controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferable embodiment thereof, it should be apparent that the invention may be modified in arrangement and detail without departing from such principles. I claim all modifications and variation coming within the spirit and scope of the following claims.

What is claimed is:

1. An apparatus comprising:
    a pseudo random signal generator to provide a first signal to a first electrode, to vary a frequency of the first signal, wherein the first electrode is configured to form a first capacitance with a second electrode;
    a demodulator to receive the first signal from the second electrode, and to receive, from the pseudo random signal generator, a reference signal indicative of the frequency of the first signal, wherein the reference signal is used to select a passing frequency used by the demodulator to pass a portion of the first signal from the second electrode; and
    detection circuitry to detect, using a demodulated first signal, a change in the first capacitance of the first electrode and the second electrode, wherein the change in the first capacitance is responsive to a presence of a first input object proximate the first electrode and second electrode, the detection circuitry further to detect, using another demodulated first signal, a change in a second capacitance of a third electrode and a fourth electrode, wherein the change in the second capacitance is responsive to a presence of a second input object proximate the third electrode and the fourth electrode, wherein the presence of the first input object is concurrent with the presence of the second input object, and wherein the other demodulated first signal corresponds to the first signal provided to the third electrode by the pseudo random signal generator, the third electrode configured to form the second capacitance with the fourth electrode.

2. The apparatus of claim 1, further comprising multiplexing circuitry to alternate which of the first electrode or a third electrode receives the first signal according to a time division scheme.

3. The apparatus of claim 1, wherein the first signal comprises an alternating current signal.

4. The apparatus of claim 1, wherein the demodulator is to vary the passing frequency to correspond with the frequency of the first signal, wherein the demodulated first signal includes the portion of the first signal at the passing frequency.

5. The apparatus of claim 1, wherein the change in the first capacitance comprises a change in capacitance at an intersection of the first electrode and the second electrode.

6. The apparatus of claim 5, wherein the first electrode and the second electrode form an electrode grid array, the first electrode being non-parallel with the second electrode.

7. An apparatus comprising:
    a pseudo random signal generator to provide a first set of electrodes with drive signals that vary in frequency, the first set of electrodes to form capacitance with a second set of electrodes; and
    detection circuitry comprising a demodulator, the demodulator to receive, from the pseudo random signal generator, reference signals indicative of the frequency of the drive signals, wherein the reference signals are used to select passing frequencies used by the demodulator to pass portions of receive signals of the second set of electrodes, wherein the receive signals of the second set of electrodes correspond to the drive signals provided to the first set of electrodes by the pseudo random signal generator, the detection circuitry to use demodulated receive signals to detect changes in the capacitance, wherein the detection circuitry is configured to detect a change in a first capacitance between a first electrode, of the first set of electrodes, and a second electrode, of the second set of electrodes, using a first demodulated receive signal and detect a change in a second capacitance between a third electrode, of the first set of electrodes, and a fourth electrode, of the second set of electrodes, using a second demodulated receive signal.

8. The apparatus of claim 7, further comprising an interpolating component to interpolate a position of an object relative to the first set of electrodes and the second set of electrodes, based on the detected changes in capacitance.

9. The apparatus of claim 7, wherein the first set of electrodes and the second set of electrodes are included in at least one of a touchpad or a touchscreen.

10. The apparatus of claim 7, further comprising multiplexing circuitry to alternate, according to a time division scheme, which electrode of the first set of electrodes is to receive the drive signals.

11. The apparatus of claim 7, wherein the detection circuitry is to vary the passing frequencies for the receive signals responsive the reference signals from the pseudo random signal generator that indicates the frequency of the drive signals.

12. The apparatus of claim 7, wherein a center frequency of the pseudo random signal generator is adjustable through a graphical user interface.

13. A method comprising:
providing, by a pseudo random signal generator, a drive signal to one electrode of each of a plurality of electrode pairs, wherein a frequency of the drive signal is varied;
receiving, at a demodulator and from the pseudo random signal generator, a reference signal indicative of the frequency of the drive signal to the one electrode of each of the plurality of electrode pairs, the reference signal used to select a passing frequency used by the demodulator to pass a portion of a receive signal;
monitoring changes in capacitance of each of the electrode pairs in view of the receive signal, the receive signal corresponding to the drive signal provided to the one electrode of each of the plurality of electrode pairs and received from the other electrode of each of the plurality of electrode pairs; and
determining, in view of the monitored changes, a position of at least two objects concurrently proximate a touch device, wherein a first change of capacitance of a first electrode pair of the plurality of electrode pairs is responsive to a presence of a first object of the at least two object, and a second change of capacitance of a second electrode pair of the plurality of electrode pairs is responsive to a present of a second object of the at least two objects.

14. The method of claim 13, wherein providing the drive signal to the one electrode of each of a plurality of electrode pairs is provided in view of a time division multiplexing scheme, the method further comprising:
determining a plurality of contact positions on a touch device, the plurality of contact positions determined within a same cycle of the time division multiplexing scheme.

15. The method of claim 13, further comprising
adjusting a center frequency of the drive signal using a graphical user interface.

16. The method of claim 13, further comprising
adjusting a sample rate of an analog to digital converter that digitizes the monitored changes in the capacitance to correspond with an adjusted center frequency.

17. The method of claim 13, further comprising
changing a cutoff frequency of a low pass filter in view of an adjusted center frequency.

18. The method of claim 13, further comprising at least one of changing a cutoff frequency of a low pass filter in view of a responsiveness of a position determination or adjusting a resistance of a pull down resistor in view of an accuracy of the position determination.

19. The method of claim 13, wherein the frequency of the drive signal is varied after an interval comprises varying the frequency of an alternating current signal.

* * * * *